(12) United States Patent
Liu et al.

(10) Patent No.: US 12,712,477 B2
(45) Date of Patent: Aug. 18, 2026

(54) SYSTEMS AND METHODS FOR ANALYZING FREQUENCY COMPONENTS OF STATOR CURRENT OF A MOTOR OPERATING AT VARYING CONDITIONS

(71) Applicant: Mitsubishi Electric Research Laboratories, Inc., Cambridge, MA (US)

(72) Inventors: Dehong Liu, Cambridge, MA (US); Shinya Tsuruta, Cambridge, MA (US)

(73) Assignee: Mitsubishi Electric Research Laboratories, Inc., Cambridge, MA (US)

( * ) Notice: Subject to any disclaimer, the term of this patent is extended or adjusted under 35 U.S.C. 154(b) by 193 days.

(21) Appl. No.: 18/602,079

(22) Filed: Mar. 12, 2024

(65) Prior Publication Data

US 2025/0293623 A1 Sep. 18, 2025

(51) Int. Cl.
*H02P 21/14* (2016.01)
*G01R 31/34* (2020.01)
*H02P 25/062* (2016.01)

(52) U.S. Cl.
CPC ............ *H02P 21/14* (2013.01); *G01R 31/343* (2013.01); *H02P 25/062* (2016.02)

(58) Field of Classification Search
CPC ..... G01R 31/343; G05B 23/024; H02P 21/14; H02P 25/062; H02P 29/024; G06F 11/0703
See application file for complete search history.

(56) References Cited

U.S. PATENT DOCUMENTS

2016/0216334 A1* 7/2016 Athikessavan ...... G01R 31/343

OTHER PUBLICATIONS

Liu et al. (D. Liu, H. Inoue and M. Kanemaru, "Robust Motor Current Signature Analysis (MCSA)-based Fault Detection under Varying Operating Conditions," 2022 25th International Conference on Electrical Machines and Systems (ICEMS), Chiang Mai, Thailand, 2022, pp. 1-5) (Year: 2022).*

* cited by examiner

*Primary Examiner* — Said Bouziane
(74) *Attorney, Agent, or Firm* — Gene Vinokur

(57) ABSTRACT

A system for controlling an operation of an induction motor is provided. The induction motor includes circuitry and a memory having instructions stored thereon that, when executed by the circuitry, causes the system to collect time-domain measurements of a stator current of the induction motor operating under varying conditions. The system transforms the time-domain measurements into a spectral domain using a sequence of STFTs based on sliding time windows over the time-domain measurements. The system performs spectral analysis in the spectral domain of the stator current to determine harmonics of different types present in the stator current of the induction motor and stabilize the determined harmonics to a shape of corresponding harmonics of the induction motor when operating under steady-state conditions. The system performs one or a combination of control, fault detection, and/or monitoring of the induction motor based on the stabilized harmonics of the induction motor.

20 Claims, 25 Drawing Sheets

SYSTEMS AND METHODS FOR ANALYZING FREQUENCY COMPONENTS OF STATOR CURRENT OF A MOTOR OPERATING AT VARYING CONDITIONS

FIELD OF THE DISCLOSURE

The present disclosure relates to induction motors and, more specifically, to a system and method for monitoring a motor operating at varying conditions by analyzing frequency components in a stator current of the motor.

BACKGROUND

Induction motors are important drive machines for industrial application due to being cost-effective, robust, and durable in different environmental conditions. However, after long time operation (such as years), the induction motor may develop faults, such as broken bar faults, eccentricity, bearing faults, etc. These faults, if not repaired and addressed, may degrade performance resulting in effects such as vibration, torque ripple, low efficiency, noise, and even catastrophic failure. Therefore, it is important to monitor the motor to detect these faults and conduct timely maintenance.

The most popular way to detect these faults is to analyze a stator current of the motor and extract fault signatures using a motor current signature analysis (MCSA)-based method. The MCSA-based method is non-invasive and does not require extra sensors to collect data. Ideally, for a three-phase induction motor, the stator current only includes an operating frequency component, such as a 50 Hz or 60 Hz component. When there is a fault, flux generated by the stator current is no longer symmetric, and will induce extra frequency components in the stator current. Different faults will generate different frequency components. These different frequency components form a fault signature frequency for the stator current. A corresponding fault type may then be detected based on the fault signature frequency. Further, fault severity may be estimated according to a ratio between a fault frequency magnitude and an operating frequency magnitude.

However, modern induction motors are typically driven by inverters enabling the motors to operate at varying operating conditions (such as varying speed and/or varying load) for high efficiency and energy-saving purposes. These varying operating conditions make fault detection a challenging problem. Accordingly, there is still a need for systems and methods for analyzing frequency components in the stator current of a motor operating at varying speeds and/or varying load conditions.

SUMMARY

The present disclosure provides systems and methods for monitoring and/or controlling operation of an induction motor under varying operating conditions, such as varying speed and/or varying load. The system is configured to capture time domain measurements of a stator current of the induction motor operating under the varying operating conditions. The system then transforms these time domain measurements into a series of frequency domain measurements via a sequence of short-time Fourier transforms (STFT). The STFTs are performed based on an overlapping series of sliding time windows during a time period of the time domain measurements. The system performs a spectral analysis of the series of frequency domain measurements to determine harmonics present in the stator current. The determined harmonics may include harmonics of many different types, such as operating frequency harmonics, slot harmonics, broken-bar fault harmonics, etc. The system then stabilizes the determined harmonics to a shape of corresponding harmonics generated when the induction motor is operating under steady-state conditions. The system may then use the stabilized harmonics to identify one or more faults or other characteristics of the induction motor operation. The system may then control the induction motor and/or perform other monitoring operations based on the detected faults and/or characteristics of the motor.

Generally, it is an object of some embodiments of the present disclosure to provide systems and methods for analyzing frequency components in time-domain measurements of the stator current of an induction motor operating at varying speeds and/or varying load conditions. The time-domain measurements of the stator current can vary significantly under different operating conditions. For example, during motor startup, the stator current may exhibit high transient peaks as the motor accelerates and reaches its rated speed. Similarly, transient conditions can also occur during sudden changes in load or power supply.

Under normal, steady-state conditions, the stator current should stabilize at a level proportional to a mechanical load of the motor. A waveform of the stator current should be sinusoidal for an AC motor, with the frequency corresponding to the electrical supply. However, under variable load conditions, changes in mechanical load on the motor can lead to variations in stator current. An increase in load typically results in a higher stator current. Also, variable frequency drives (VFDs) can dynamically adjust the motor speed, affecting the stator current. Further, motors with variable speed drives can exhibit variations in the stator current based on a speed reference and control strategy, and, hence, the stator current may not strictly follow a sinusoidal waveform in these cases.

Monitoring the stator current under different operating conditions can be advantageously used for predictive maintenance and troubleshooting. Anomalies in the current waveform can indicate potential issues within the motor or its control system. Faults in the motor or its associated systems can cause irregularities in the stator current waveform. Common faults include rotor imbalances, stator winding faults, phase imbalances, and bearing issues. However, various techniques developed for detecting faults in the motor operating in the steady-state condition, can fail, or at least can be suboptimal, when the motor operates in transient, e.g., under variable load, conditions.

This varying operating condition can make fault detection a challenging problem for two reasons. First, most fault frequencies are speed dependent. During varying speed operation, the fault frequency also varies within a frequency range. This frequency range may also vary for different fault signatures based on a physical model, making it difficult to extract the fault frequency according to a fixed frequency. Second, the varying operation spreads the fault frequency component energy within the frequency range, which lowers the ratio between the fault frequency component magnitude and the operating frequency component (50 Hz or 60 Hz fixed) magnitude. Consequently, a fault may not be detected based on a threshold to the magnitude ratio set for steady operation conditions, or the severity level may not be accurately estimated.

To address the aforementioned limitations, some embodiments, additionally or alternatively to performing fault detection based on the current signature analysis of a motor operating under variable load conditions, introduce a spectral stabilizer configured to transform the stator current signature of a motor operating under variable load conditions into the stator current signature of a motor operating under steady-state conditions, and then perform fault detection and other monitoring operations on these stabilized signals. Such an approach decouples the estimation of the disturbance introduced by the load variation from the stator current analysis and allows the system to reuse legacy fault detection and monitoring techniques suitable for various motor control and maintenance applications.

In addition, decoupling the stabilization of the stator current signature from the fault detection allows for various embodiments for configuring spectral analyzers specifically for the stabilization tasks, which may not be possible or practical for different tasks, like fault detection on the current under varying load conditions. For example, some embodiments are based on realizing that the stabilization of different harmonics can be shaped-based, i.e., a shape of the harmonics of different types of harmonics present in the stator current of the induction motor operating under varying conditions can be transformed, e.g., fit in, into a shape of corresponding harmonics present in the stator current of the induction motor operating under steady-state conditions.

Specifically, some embodiments of the present disclosure are based on recognizing, that the stator current signature of an induction motor operating under steady-state conditions can have different types of harmonics corresponding to different characteristics of the operation of the motor. For example, the stator current signature typically includes harmonics corresponding to the operational frequency of the motor. Additionally, the stator current signature can include slot harmonics corresponding to additional harmonics in the stator current that result from the presence of slots in the stator core. These slots are essential for accommodating the stator windings, but they can introduce harmonics in the magnetic field and subsequently affect performance of the motor. Additionally or alternatively, the stator current signature can include harmonics corresponding to different faults of the motor. For example, broken-bar faults typically result in characteristic frequency in the motor current spectrum. As a result, broken-bar fault characteristic frequency and/or higher order frequencies can be present in the frequency spectrum of the induction motor.

All of these different types of harmonics/frequency components exhibit different shapes and spectral characteristics that can be learned for an induction motor operating under steady-state conditions using model and/or data-driven analysis. Knowing these shapes and spectral characteristics enables different embodiments to use data fitting in the spectral domain of the induction motor operating under varying conditions to stabilize the current signature of the induction motor.

Generally, in one aspect, a system for controlling an operation of an induction motor is provided. The induction motor includes circuitry and a memory. The memory, having instructions stored thereon that, when executed by the circuitry, causes the system to collect time-domain measurements of a stator current of the induction motor operating under varying conditions.

The system is further caused to transform the time-domain measurements into a spectral domain using a sequence of STFTs based on sliding time windows over the time-domain measurements.

The system is further caused to perform spectral analysis in the spectral domain of the stator current to determine harmonics of different types present in the stator current of the induction motor and stabilize the determined harmonics to a shape of corresponding harmonics of the induction motor when operating under steady-state conditions.

The system is further caused to perform one or a combination of control, fault detection, and/or monitoring of the induction motor based on the stabilized harmonics of the induction motor.

According to an example, the varying conditions include varying speed conditions.

According to an example, the varying conditions comprise varying load conditions.

According to an example, stabilization of the harmonics of different types is subject to different constraints on the shape of the harmonics.

According to an example, the harmonics of different types include harmonics of an operating frequency component of the induction motor. The shape constraints on the harmonics of the operating frequency component force the harmonics of the operating frequency component to form straight lines in the spectral domain.

According to an example, the harmonics of different types include slot harmonics. The shape constraints on the slot harmonics force the slot harmonics to have a varying speed-dependent frequency shift for different instances of time. The frequency shift is determined by a sparsity-driven optimization problem using $L_1$ regularization.

According to an example, the harmonics of different types include broken-bar fault frequencies. The shape constraints on the broken-bar fault frequencies force the broken-bar fault frequencies to have a frequency shift. The frequency shift is a fixed fraction of the frequency shift of the slot harmonics for different instances of time.

According to an example, the fixed fraction is based on one or more motor parameters. The one or more motor parameters may include number of slots and number of pole pairs.

According to an example, the circuitry is configured to detect harmonics of the operating frequency component based on magnitude variation of spectral frequency values over different instances of time to estimate current shapes of the harmonics of the operating frequency component and fit a straight line into a current shape of each of the harmonics of the operating frequency component, such that the straight lines define stabilized harmonics of the operating frequency component.

According to an example, the circuitry is configured to determine frequency shifts of slot harmonics corresponding to an eccentricity fault based on a robust sparsity-driven method using L1 regularization. The circuitry is further configured to compensate the frequency shift of each time window spectrum, such that the slot harmonics after frequency compensation define stabilized slot harmonics in a fixed frequency line.

According to an example, the circuitry is configured to determine a frequency shift of broken-bar fault harmonics based on the corresponding frequency shifts of slot harmonics. The circuitry is further configured to compensate the frequency shifts of two broken-bar fault signatures, one broken-bar fault signature below operating frequency and one broken-bar fault signature above the operating frequency, respectively, such that the two broken-bar fault signatures define frequencies of stabilized broken-bar fault signatures.

According to an example, to stabilize harmonics of a fault frequency component detected in the spectral domain of the induction motor operating under the varying conditions into a corresponding stabilized fault frequency component of the induction motor operating under steady-state conditions, the circuitry is configured to (1) determine frequency shifts of the fault frequency component in different spectra produced by STFTs in the sequence of STFTs; and (2) align the frequency shifts of the fault frequency component to produce the stabilized fault harmonics.

According to an example, to determine the frequency shifts of the fault harmonics, the circuitry is configured to (1) correlate frequency spectrums of neighboring STFTs in the sequence of STFTs to produce noisy frequency shifts subject to sparse non-Gaussian noise; and (2) perform a sparse recovery of the noisy frequency shifts to denoise the frequency shifts.

According to an example, the sparse recovery includes an $L_1$ regularizer on the sparse non-Gaussian noise.

According to an example, the circuitry is configured to solve the sparse recovery using an alternating minimization iteratively updating the frequency shifts and a sparse noise matrix of the sparse non-Gaussian noise.

According to an example, the circuitry is configured to: (1) align the frequency shifts of the fault harmonics on a circular shift to produce a matrix of aligned spectra; and (2) perform a singular value decomposition of the matrix of aligned spectra to produce the stabilized fault harmonic.

According to an example, the stabilized fault frequency is determined as the largest frequency component of a left principal singular vector of the singular value decomposition of the matrix of aligned spectra.

According to an example, wherein, to stabilize harmonics of a fault frequency component detected in the spectral domain of the induction motor operating under the varying conditions into a corresponding stabilized fault frequency of the induction motor operating under a steady-state conditions, the circuitry is configured to (1) determine frequency shifts of the fault frequency component in different spectra produced by STFTs in the sequence of STFTs; and (2) perform a sparse recovery of the stabilized fault frequency subject to the frequency shifts.

According to an example, the circuitry is further configured to estimate motor speed of the induction motor based on the frequency shifts.

In various implementations, a processor or controller can be associated with one or more storage media (generically referred to herein as "memory," e.g., volatile and non-volatile computer memory such as ROM, RAM, PROM, EPROM, and EEPROM, floppy disks, compact disks, optical disks, magnetic tape, Flash, OTP-ROM, SSD, HDD, etc.). In some implementations, the storage media can be encoded with one or more programs that, when executed on one or more processors and/or controllers, perform at least some of the functions discussed herein. Various storage media can be fixed within a processor or controller or can be transportable, such that the one or more programs stored thereon can be loaded into a processor or controller so as to implement various aspects as discussed herein. The terms "program" or "computer program" are used herein in a generic sense to refer to any type of computer code (e.g., software or microcode) that can be employed to program one or more processors or controllers.

It should be appreciated that all combinations of the foregoing concepts and additional concepts discussed in greater detail below (provided such concepts are not mutually inconsistent) are contemplated as being part of the inventive subject matter disclosed herein. In particular, all combinations of claimed subject matter appearing at the end of this disclosure are contemplated as being part of the inventive subject matter disclosed herein. It should also be appreciated that terminology explicitly employed herein that also can appear in any disclosure incorporated by reference should be accorded a meaning most consistent with the particular concepts disclosed herein.

Other features and advantages will be apparent from the description and the claims.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the various embodiments.

DETAILED DESCRIPTION

In the following description, for purposes of explanation, numerous specific details are set forth in order to provide a thorough understanding of the present disclosure. It will be apparent, however, to one skilled in the art that the present disclosure may be practiced without these specific details. In other instances, apparatuses and methods are shown in block diagram form only in order to avoid obscuring the present disclosure.

As used in this specification and claims, the terms “for example,” “for instance,” and “such as,” and the verbs “comprising,” “having,” “including,” and their other verb forms, when used in conjunction with a listing of one or more components or other items, are each to be construed as open ended, meaning that that the listing is not to be considered as excluding other, additional components or items. The term “based on” means at least partially based on. Further, it is to be understood that the phraseology and terminology employed herein are for the purpose of the description and should not be regarded as limiting. Any heading utilized within this description is for convenience only and has no legal or limiting effect.

The present disclosure provides systems and methods for monitoring and/or controlling operation of an induction motor under varying operating conditions, such as varying speed and/or varying load. The system is configured to capture time domain measurements of a stator current of the induction motor operating under the varying operating conditions. The system then transforms these time domain measurements into a series of frequency domain measurements via a sequence of short-time Fourier transforms (STFT). The STFTs are performed based on an overlapping series of sliding time windows during a time period of the time domain measurements. The system performs a spectral analysis of the series of frequency domain measurements to determine harmonics present in the stator current. The determined harmonics may include harmonics of many different types, such as operating frequency harmonics, slot harmonics, and broken-bar fault harmonics. The system then stabilizes the determined harmonics to a shape of corresponding harmonics generated when the induction motor is operating under steady-state conditions. The system may then use the stabilized harmonics to identify one or more faults or other characteristics of the induction motor operation. The system may then control the induction motor and/or perform other monitoring operations based on the detected faults and/or characteristics of the motor.

Turning now to the figures, an inverter-fed motor operating at a constant speed and a constant load condition is first considered. The motor is then generalized to varying speed and varying load conditions.

Figure 1:
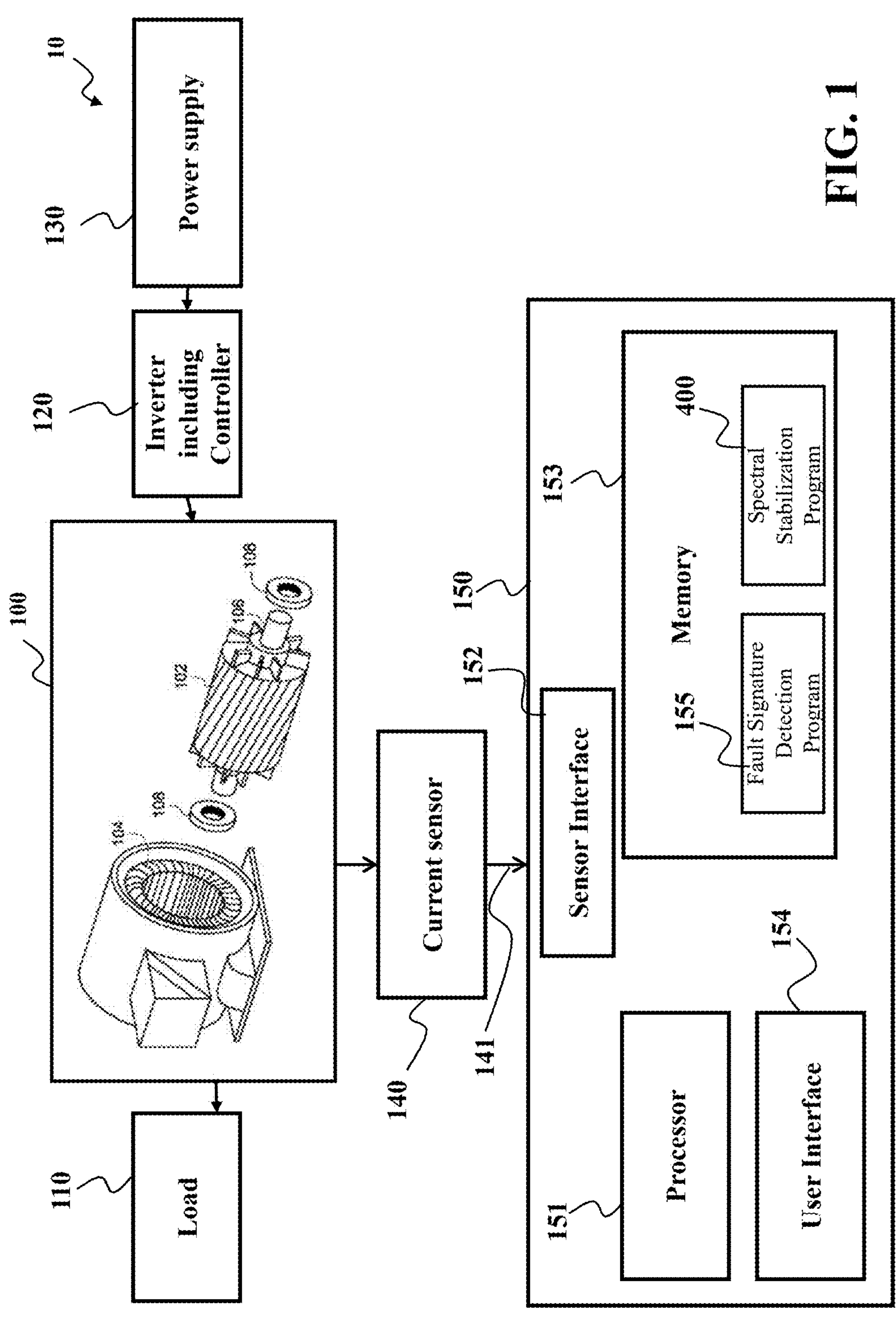
FIG. 1 is a schematic of an inverter-fed induction motor drive system configured with a fault detection system and a spectral stabilization system, according to some embodiments of the present disclosure.

FIG. 1 is a schematic of a fault detection system 10 illustrating a non-limiting example of an inverter-fed induction motor-drive system according to one embodiment of an invention. Generally, the fault detection system 10 includes the induction motor 100, a load 110, an inventor 120, a power supply 130, a current sensor 140, and a fault detection module 150.

In various embodiments, the induction motor 100 includes a rotor assembly 102, a stator assembly 104, a main shaft 106, and two main bearings 108. In one non-limiting example, the induction motor 100 is a squirrel-cage induction motor. Typical faults for such an induction motor 100 include a broken rotor bar of the rotor assembly 102, an eccentricity fault of misalignment between the rotor assembly 102 and the stator 104, a bearing fault of one or more of the bearings 108, etc. An inverter 120 is powered by a power supply 130 and includes a controller, such as an integrated controller. Accordingly, the inverter 120 may be used for monitoring and controlling operation of the induction motor 100 in response to various inputs in accordance with embodiments of the present invention. For example, the inverter 120 coupled with the induction motor 100 can control the speed of the induction motor 100 based on inputs received from sensors 140 configured to acquire data pertaining to operating conditions of the induction motor 100. According to certain embodiments, the sensors 140 may be electrical signal sensors such as current and/or voltage sensors for acquiring current and/or voltage data pertaining to the induction motor 100. For example, a current sensor may sense current data from one or more of the multiple phases of the induction motor. More specifically, in the case of the induction motor embodied as a 3-phase induction motor, current sensors and voltage sensors sense current data and voltage data from the each of the three phases of the 3-phase induction motor. While certain embodiments of the present invention will be described with respect to a multi-phase induction motors, other embodiments of the present invention can be applied to other multi-phase electromechanical machines. In even further examples, the current sensor 140 may be configured to capture a stator current 141 corresponding to the stator 104 of the induction motor 100.

The load 110 driven by the induction motor 100 could be a water pump, a fan, a factory machine, or even aspects of transportation system such as an electric vehicle, a train, etc. During operation, variations of the load 110 may cause the motor speed controlled by the inverter controller 120 to change within a wide range to meet the load requirement.

Further, in various embodiments, the fault-detection module 150 includes a processor 151, a sensor interface 152, a memory 153 to store sensor data, and a user interface 154. A fault signature detection program 155 and a spectral stabilization program 400 stored in a storage to be uploaded to the memory 153 when the instructions of the programs 155, 400 are performed by the processor 151. The module 150 further includes a sensor interface 152 configured to acquire signals from the sensors 140, such as the stator current 141. The sensor interface 152 includes A/D (analog/digital) and D/A (digital/analog) converters to perform data communication with the processor 151, the memory 153, the user interface 154, the fault detection program 155, and the sensor 140. The processor 151 may be embodied as multiple processors, and the memory 153 may be a memory module that includes multiple memories. The user interface 154 may be configured to connect to a keyboard and a display unit configured indicate the normal/fault status information of the induction motor 100 in response to the output of the fault-detection module 150.

When the induction motor 100 is healthy, the stator current 141 includes a fundamental operating frequency component and harmonics of the fundamental operating frequency component. The time-domain stator current can be represented as:

$$i_h(t) = I_s\cos(2\pi f_s t + \phi_s) + \sum\nolimits_n I_{s,n}\cos(2\pi f_{s,n} t + \phi_{s,n}), \quad (1)$$

where $f_s$ is the operating frequency, $I_s$ is the operating current amplitude related to the motor load condition, $\phi_s$ is the initial phase of the operating frequency component, and n represents the harmonic order number.

If a motor fault occurs, the stator current signal includes additional induced frequency components:

$$i_f(t) = i_h(t) + \sum\nolimits_l I_{f,l}\cos(2\pi f_{f,l} t + \phi_{f,l}) \quad (2)$$

where $I_{f,l}$ represents the amplitude of the lth fault frequency component $f_{f,l}$, and $\phi_{f,l}$ is the initial phase of the lth fault frequency component.

Extensive research work has been done in identifying the fault frequency based on different physical models. For example, when a broken bar fault occurs in a squirrel-cage induction motor, the fault frequency can be expressed as:

$$f_{bar} = (1 \pm 2\tau s)f_s, \quad (3)$$

where $\tau$=1, 2, . . . , and s is motor slip, which can be calculated using the motor speed $n_r$ and the synchronous speed $n_s$ as $$s = \frac{n_s - n_r}{n_s}.$$

For a bearing fault, depending on fault location and bearing size, a characteristic fault frequency induced in the stator current is proportional to the mechanical frequency of the rotor $$f_r = \frac{1-s}{p} f_s, \text{ i.e.:}$$

$$f_b \propto \frac{1-s}{p} f_s, \quad (4)$$

Eccentricity faults in most induction machines can be identified according to slot harmonics in the current signal:

$$f_{slt} = \left((\kappa Z \pm nd)\frac{1-s}{p} + v\right)f_s, \quad (5)$$

where Z is a number of rotor slots; p is a number of pole pairs; $\kappa$=1, 2, 3; $n_d$ is the eccentricity order ($n_d$=0 in case of static eccentricity and $n_d$=1, 2, 3, . . . , in case of dynamic eccentricity); and $\nu$=±1, ±3, ±5, . . . is the order of stator time harmonics.

Therefore, for most motor fault detection problems, the objective of MCSA-based methods is to extract the corresponding fault signature components via effectively frequency spectral analysis. Once a fault frequency component over a certain magnitude threshold is detected, it is presumed that there exists a corresponding fault. The fault severity level can then be estimated depending on the magnitude of the fault frequency component.

For the following example, let $i_s(t)$ represent the time-domain stator current of a motor in an ideal steady-state operation. Note that the current could be a single-phase current or a combination of three phase current after proper phase alignment, such as Park transform. The frequency spectrum of the stator current $i_s$ ($i_h$ for healthy condition or $i_f$ for faulty condition) can be achieved by the Fourier transform as:

$$I_s(\omega) = \int i_s(t)e^{-j\omega t}dt. \quad (6)$$

For periodic signals in motor operations, a discrete Fourier transform (DFT) is typically used to compute the Fourier spectrum based on n discrete time samplings. The detailed correspondence between the frequency and the sampling rate may be ignored, and the Fourier spectrum may be simply expressed as:

$$[I(n_f)] = DFT[i_s(n_t)], \quad (7)$$

where $n_t$ and $n_f$ represent discrete time and frequency respectively.

From above equations, it is observed that most motor fault signatures are related to the motor slip s. However, when the motor is operating at varying load and varying speed conditions, both the fault frequency and the corresponding amplitude will vary accordingly. It is challenging to extract the fault signature for online monitoring and fault detection. Accordingly, FIG. 1 includes the spectral stabilization program 400 as an aspect of the memory 153 of the fault detection module 500. The spectral stabilization program 400 is configured to adjust the determined harmonics of the stator current of the varying motor to a shape of corresponding harmonics of the induction motor under steady-state conditions, thereby enabling the fault detection program to evaluate or identify one or more of the various types of faults.

Figure 2A:
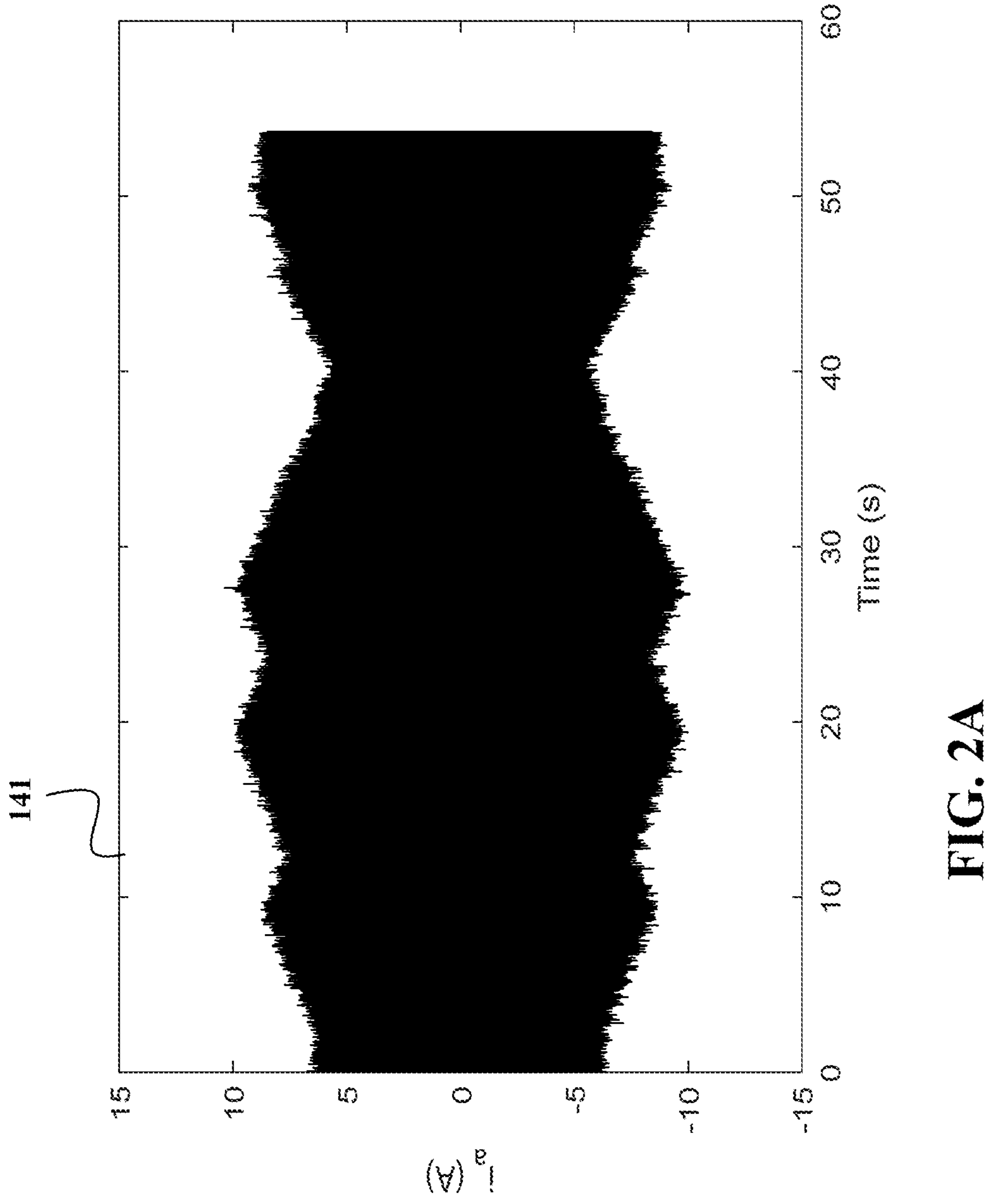
FIG. 2A is a plot of a time-domain stator current of a motor operating at a varying speed condition, according to some embodiments of the present disclosure.
Figure 2B:
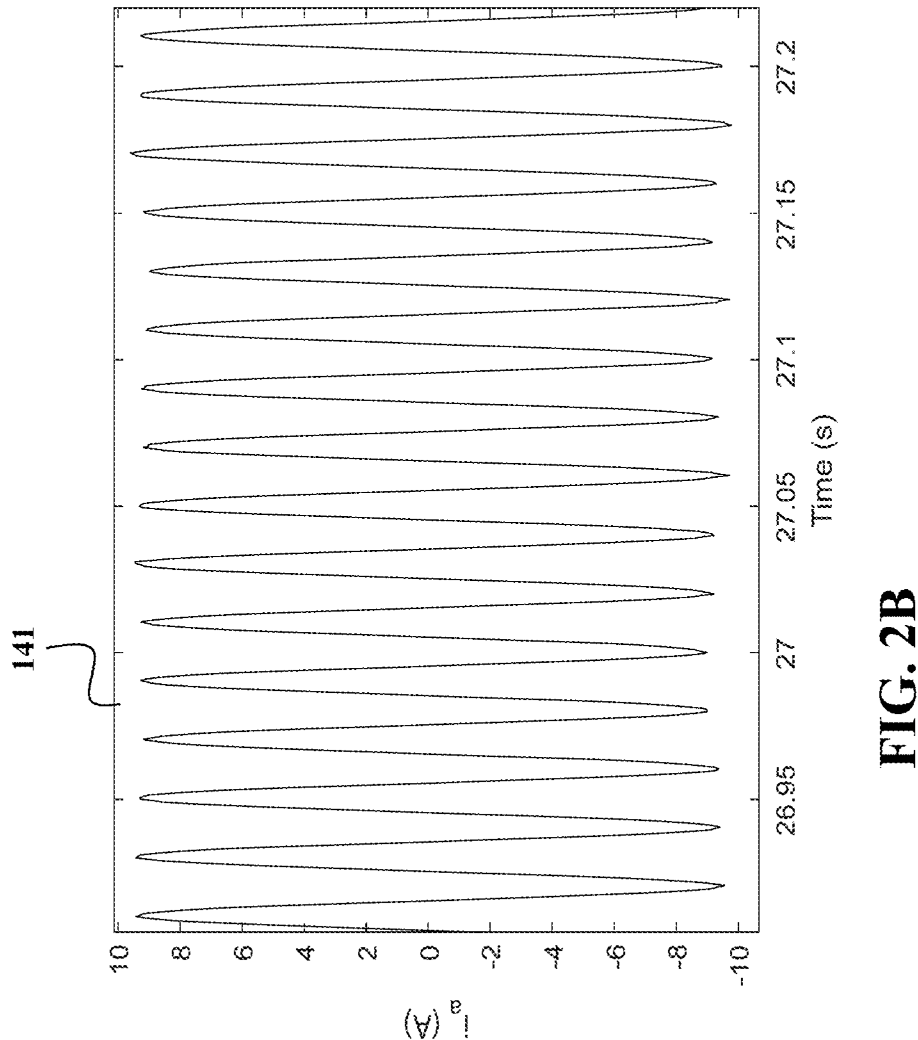
FIG. 2B is a plot of a zoomed-in version of the stator current of a motor operating at a varying speed condition, according to some embodiments of the present disclosure.

An example plot of time-domain stator current 141 of the motor 100 operating at a varying load condition is shown in FIG. 2A. FIG. 2A shows approximately 53 seconds of time-domain data with a sampling rate of 2 kHz. Due to the varying load, the amplitude of the stator current 141 also changes from time to time to meet the load requirement. A zoomed-in version of the stator current 141 is shown in FIG. 2B, showing approximately 0.35 seconds the time domain stator current 141 of FIG. 2A.

Figure 3A:
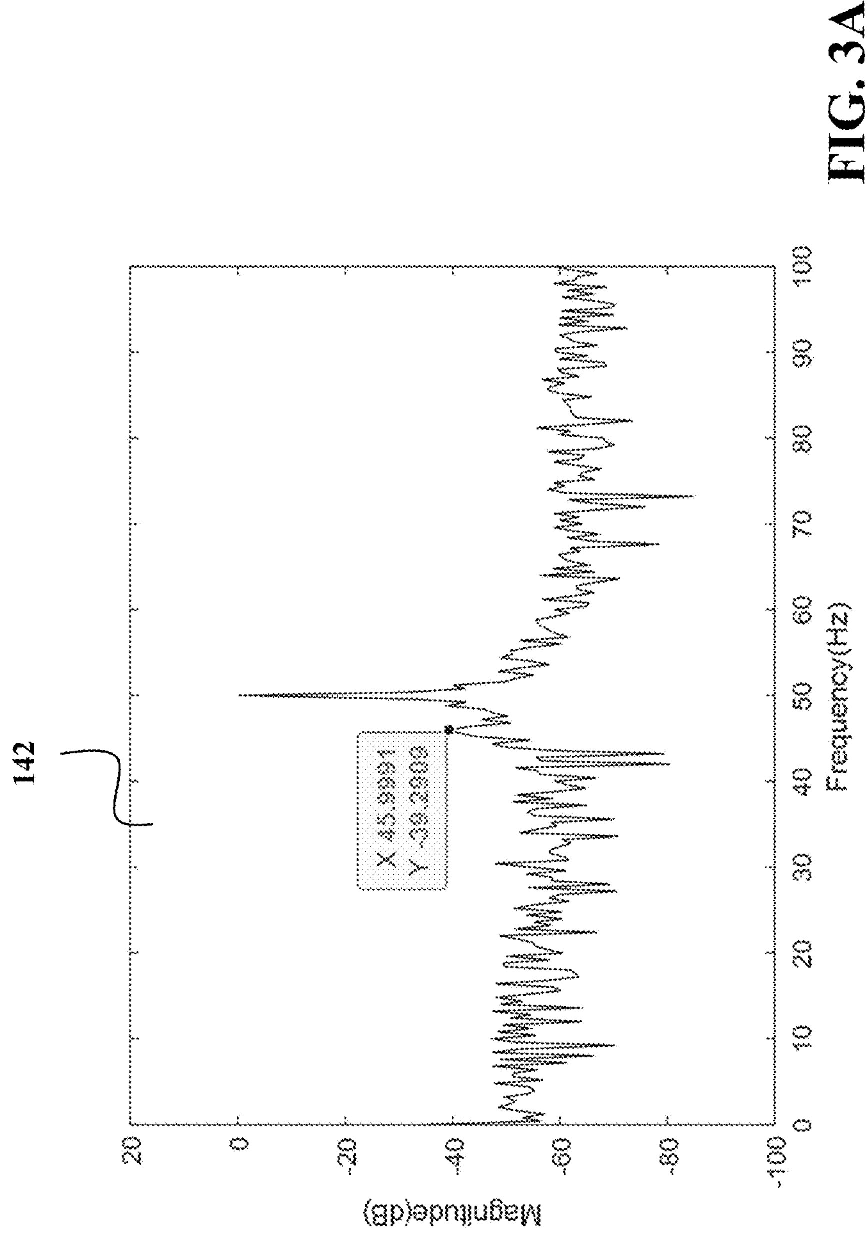
FIG. 3A is a frequency spectrum of stator current of a short-time window measurement of 2.5 seconds, according to some embodiments of the present disclosure.
Figure 3B:
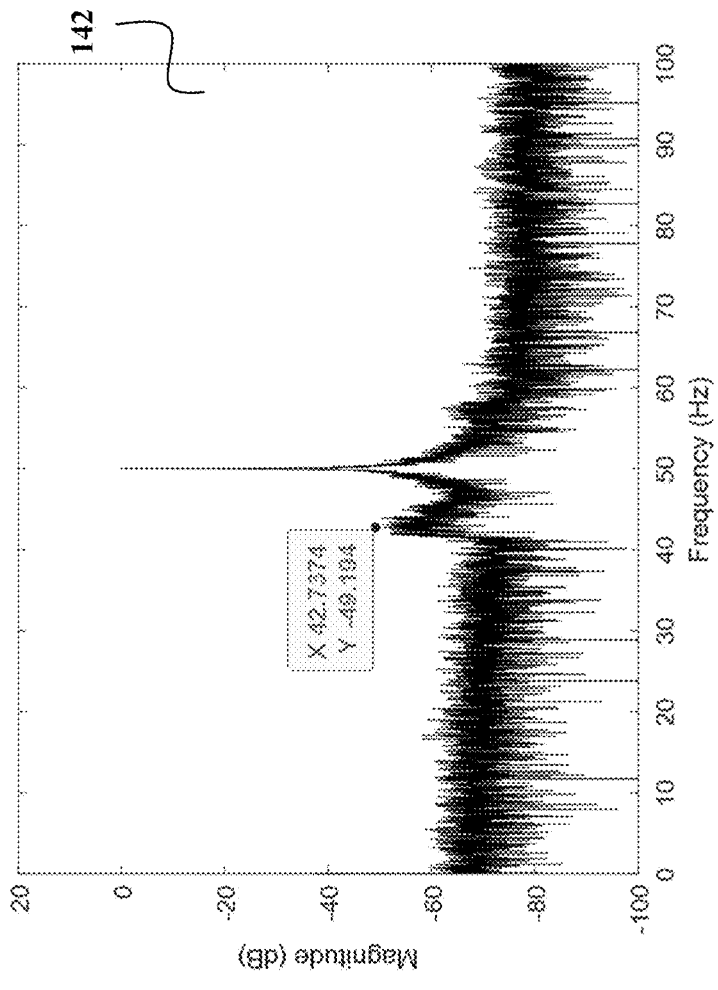
FIG. 3B is a frequency spectrum of stator current of a long-time window measurement of 50 seconds, according to some embodiments of the present disclosure.
Figure 3C:
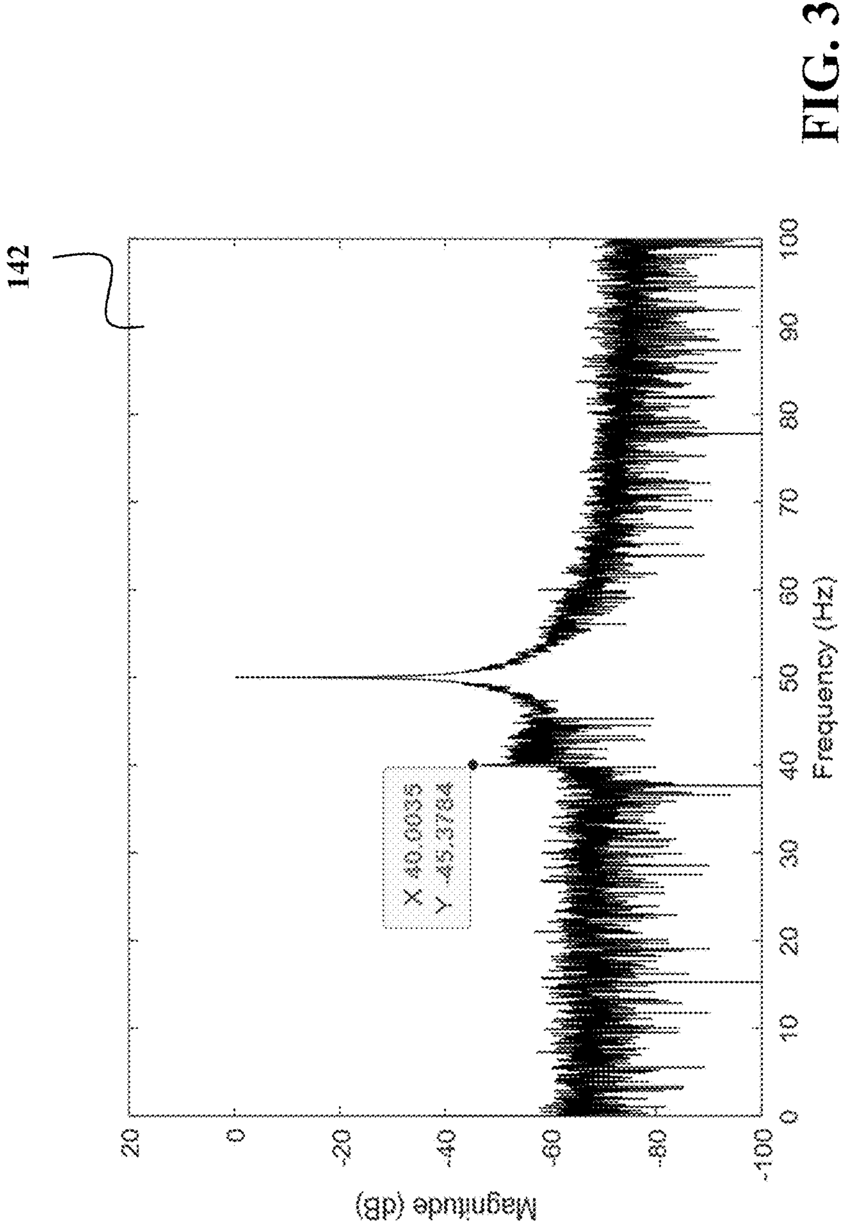
FIG. 3C is another frequency spectrum of stator current of a long-time window measurement of 50 seconds, according to some embodiments of the present disclosure.

FIGS. 3A and 3B show example Fourier spectrums 142 of the stator current 141 when a faulty motor 100 is operating at a varying speed and/or under a varying load condition. When 2.5 second time-domain stator current 141 is collected, its Fourier spectrum 142 is shown in FIG. 3A. With a normalized operating frequency component at 50 Hz, a frequency component of around 46 Hz with magnitude of −39.3 dB is observed. Since the frequency spectrum is noisy, it is uncertain if this component corresponds to a broken-bar fault or not. If longer-time current data of about 50 seconds is collected, the corresponding Fourier spectrum 142 is shown in FIG. 3B. It can be observed that, at the left side of the operating frequency, the maximum magnitude appears at frequency 42.7 Hz with magnitude of −49.2 dB, almost 10 dB lower than that of the short-time window of FIG. 3A. As another example, a Fourier spectrum of 50 second time-domain current data is shown in FIG. 3C. The spectrum of FIG. 3C was measured at a different time and according to different speed variation patterns than the spectrum of FIG. 3B. It can be observed that, at the left side of the operating frequency, the maximum magnitude appears at a frequency of 40.0 Hz with a magnitude of −45.4 dB, about 6 dB lower than that of a short-time window.

From FIGS. 3B and 3C, it can be observed that a fault frequency component spans a frequency range, depending on the motor speed. Further investigation has shown that this is because the varying-speed operation causes the fault frequency changes accordingly. According to Parseval's theorem, the sum (or integral) of the square of a time-domain signal is equal to the sum (or integral) of the square of its Fourier transform.

Figure 4:
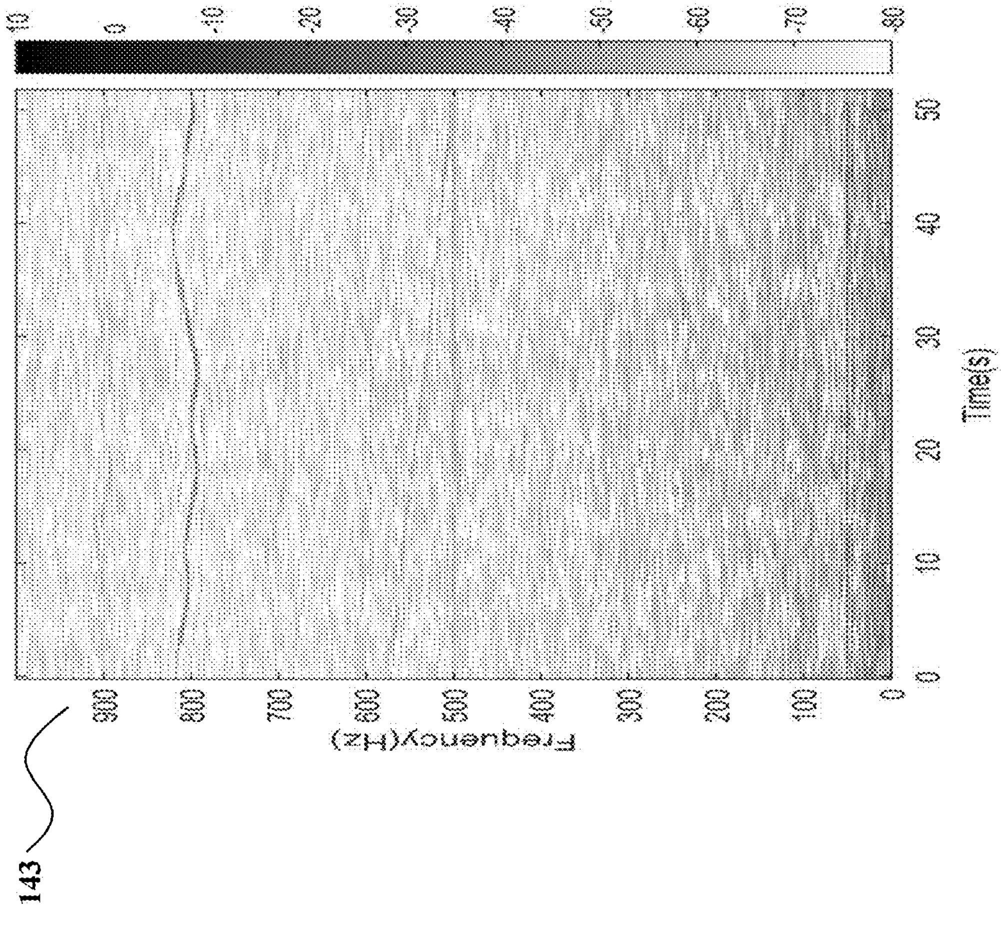
FIG. 4 is a short-time Fourier transform (STFT) spectrum in the frequency range of interest, according to some embodiments of the present disclosure.

Therefore, as more measurements are collected in the time-domain, the operating frequency energy accumulates at a fixed operating frequency point in the Fourier domain, while the fault frequency energy spreads in a frequency range depending on the speed change. Ultimately, the ratio between the fault frequency component and the operating frequency component decreases to a lower level depending on the motor speed range. Similar phenomena happen to frequency components corresponding to other faults. Although the Fourier spectrum of a short-time window may provide the right ratio, the spectrum is very noisy, and may be influenced by other interference. In practice, an empirical threshold may be set to detect the fault, but the fault severity may be underestimated. Therefore, the proper way to deal with this issue is to adaptively align the fault frequency of short-time windows such that the overall fault frequency energy can be added up. Following this idea, the following method based on physical model and sparse signal processing is disclosed. A Fourier spectral analysis is performed on a short-time current of 2.5 second sliding time window, with 2 seconds overlap from window to window. A minimum variance-based spectral analysis method is considered to suppress the noise in the spectra and reduce the influence of varying load. FIG. 4 shows a short-time Fourier transform (STFT) spectrum 143 in the frequency range of interest (0 to 1 kHz) using a minimum-variance based denoising method.

For fault frequency detection at varying speed and varying load conditions, an essential task is to align the fault frequency component in the frequency domain such that methods for constant speed operations can be used to extract the fault frequency component. Note that the magnitude of fault signature signals are typically much smaller than that of the operating frequency signal. Further, the measurements are also noisy. Therefore, the fault frequency alignment is sensitive to the measurement noise and other inverter interference. To improve the robustness, signals can be extracted iteratively accordingly to their frequency range such that a fault signal may be estimated. For those fault signals of varying frequency due to speed variation, the following robust method is proposed to estimate the frequency shift such that the fault frequency of different time windows can be well aligned.

Figure 5:
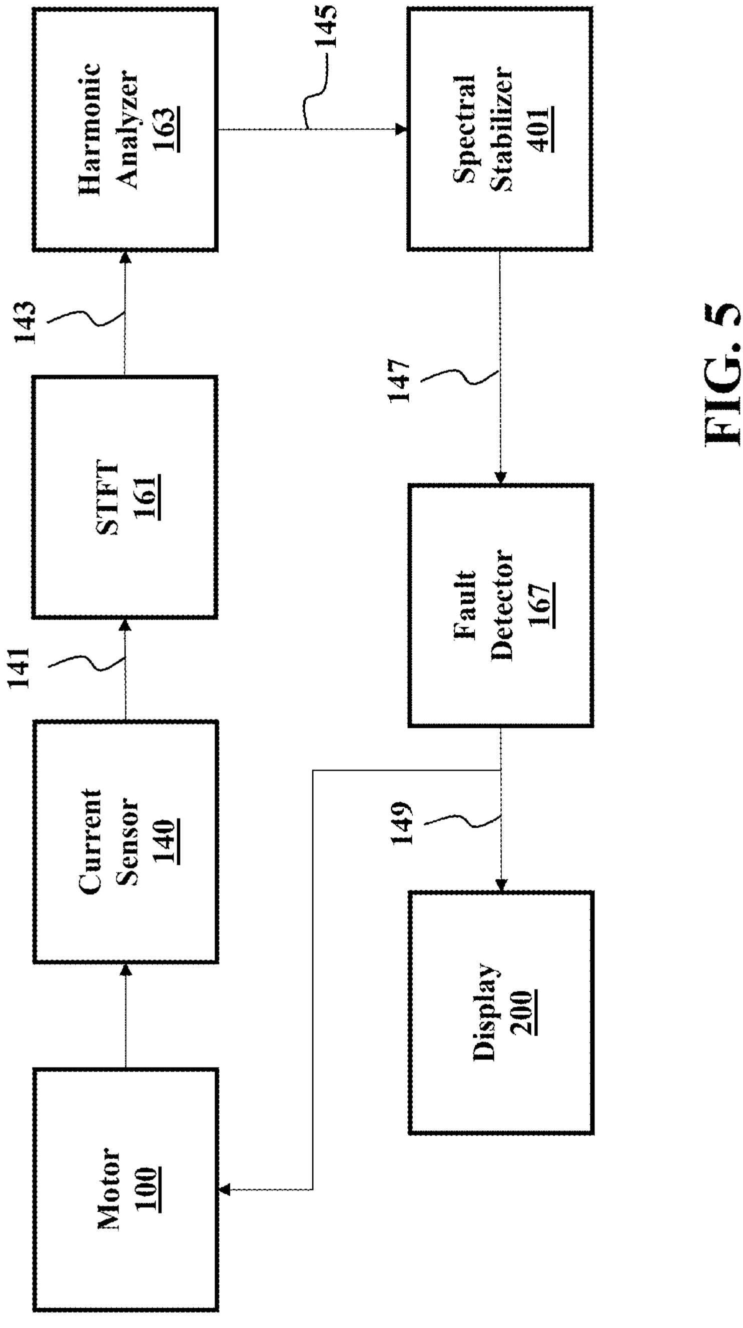
FIG. 5 is a further schematic diagram of aspects of a fault-detection system 10, according to some embodiments of the present disclosure.

FIG. 5 illustrates a further schematic diagram of aspects of the system 10 of FIG. 1. Broadly, FIG. 5 shows the motor 100, the current sensor 140, a short-time Fourier transformer 161, a harmonic analyzer 163, a spectral stabilizer 401, a fault detector 167, and a display 200. As shown in FIG. 5, the current sensor 140 captures the stator current 141 of the motor in the time domain. The current sensor 140 then provides the stator current 141 to the short-time Fourier transformer 161. Referring back to FIG. 1, the short-time Fourier transformer 161 may be implemented as an aspect of the spectral stabilization program 400. The short-time Fourier transformer 161 generates the STFT spectrum 143 corresponding to the time domain stator current 141. An example of the STFT spectrum 143 is shown in FIG. 4.

The STFT spectrum 143 is provided to the harmonic analyzer 163. The harmonic analyzer 163 may be implemented as an aspect of the fault signature detection program 155 of FIG. 1. The harmonic analyzer 163 identifies one or more harmonics 145 within the STFT spectrum 143. These harmonics 145 may include frequency components of many different types, such as operating frequency harmonics, slot harmonics, and broken-bar fault frequency.

These harmonics 145 are then provided to the spectral stabilizer 401. The spectral stabilizer 401 generates stabilized harmonics 147 based on a shape of corresponding harmonics generated when the motor 100 is operating under steady-state conditions. The shape may be defined by one or more constraints. In this example, the constraints of the shape of the corresponding harmonics may include both the amplitude and frequency of the harmonics under steady-state conditions.

The stabilized harmonics 147 are then provided to the fault detector 167. The fault detector 167 is configured to analyze the stabilized harmonics 147 to generate one or more fault signals 149. In some examples, the fault signals 149 are provided to the motor 100 as a feedback mechanism to control the operation of the motor 100. For example, the fault signals 149 may cause the motor 100 to change speeds to shut off based on the types of faults represented by the fault signals 149. Further, the fault signals 149 may be provided to the display 200. The display 200 may then show a user information regarding the detected faults, such as the type of fault and/or troubleshooting steps for addressing the fault.

Figure 6:
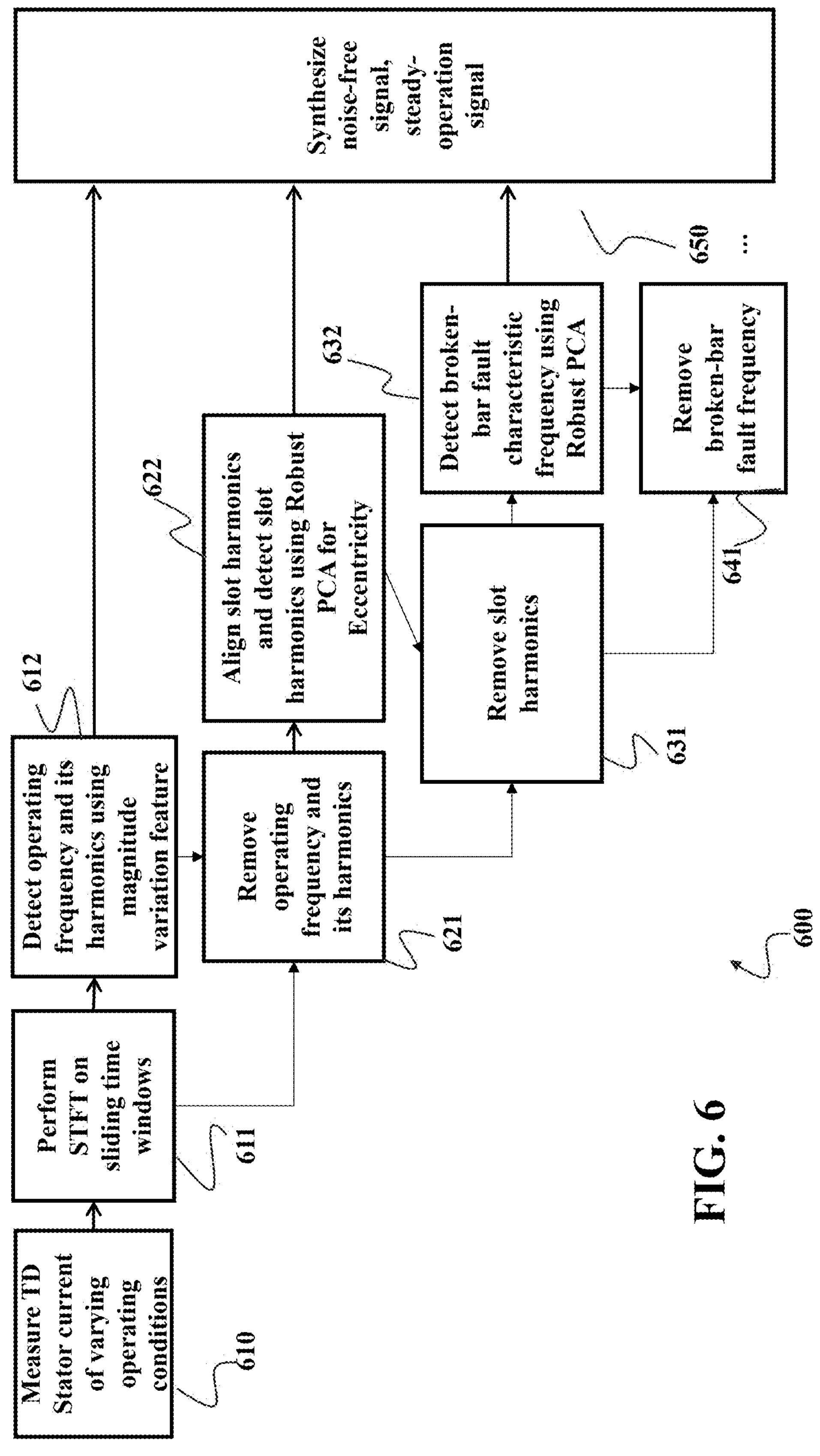
FIG. 6 is a flow chart of a method for stator current frequency component analysis of a motor operating at varying speed and/or varying load conditions, according to some embodiments of the present disclosure.

FIG. 6 is a flow chart of a method 600 of frequency components analysis in the stator current 141 of a motor 100 operating at varying speed and/or varying load conditions.

Time-domain stator current 141 is measured, in step 610, by the current sensor 140 and stored in the memory 153. A short-time Fourier transform is performed, in step 611, on each short-time window measurement of stator current 141 to achieve the STFT frequency spectrum 143. This process can be performed on the fly of measuring the stator current 141.

For each frequency in the STFT frequency spectrum 143, an average magnitude and a magnitude variation are calculated as features to detect 612 an operating frequency and its harmonics. If one or more average magnitudes are greater than a preset threshold and their corresponding magnitude variations are smaller than another preset threshold, the corresponding frequency components are identified as the operating frequency and its harmonics. The detected operating frequency and its harmonics are then removed, in step 621, from the STFT frequency spectrum 143 for further analysis.

The residual STFT frequency spectrum 143 includes speed-dependent frequency components. It is necessary to align those frequency components for better detection and fault severity estimation. Slot harmonics are first aligned, in step 622, using an estimated frequency shift of each short time window by robust principal component analysis (RPCA) method, and then detected using PCA. The detected slot harmonics are then removed, in step 631, from the STFT frequency spectrum for further analysis.

According to the frequency shifts of slot harmonics of different time windows, frequency shifts of broken-bar frequency components can be detected, in step 632, for broken-bar frequency alignment. Broken-bar frequency components are then removed, in step 641, after proper alignment 641.

All extracted frequency components, including operating frequency and its harmonics, slot harmonics, and broken-bar frequency components are speed-independent, meaning equivalent to that at constant speed operation. These extracted frequency components are put together to synthesize, in step 650, the equivalent frequency spectrum of stator current of a motor operating at a constant speed. The fault severity level can then be estimated accurately, based on the synthesized equivalent spectrum, without influence of the speed variation.

Figure 7:
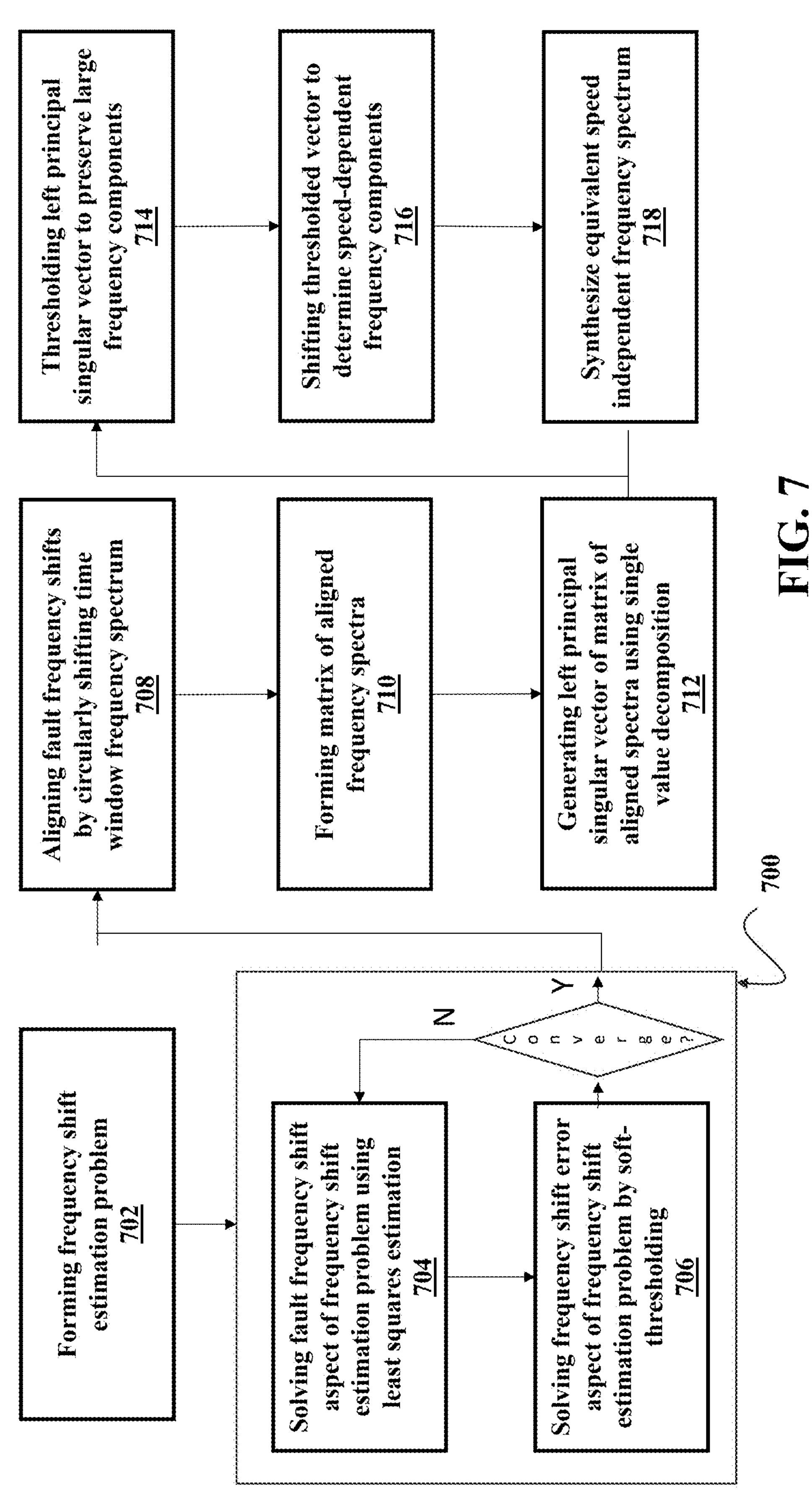
FIG. 7 is a flow chart of a method for generating a speed-independent frequency spectrum of a current measurement, according to some embodiments of the present disclosure.

FIG. 7 is a flow chart of a method 700 for generating a speed-independent frequency spectrum of a speed-varying current measurement. Let $[I_i(n_f)]$ be the frequency spectrum of the ith (i=1, . . . , N) time window stator current. Due to the varying speed vary load operation, the fault frequencies are not constant, but exhibits a speed-dependent shift from the average fault frequency. Without loss of generality, let $h_k$ be a column vector of the kth fault frequency shift across all time windows, in which the ith entry $h_k(i)$ is the fault frequency shift corresponding to the ith time window. It is clear that $h_k=0$ for steady constant-speed operations. The fault frequency difference between the ith and the jth time windows due to speed variation is $$L_k(i, j) = h_k(i) - h_k(j), \text{ for } i, j = 1, 2, \ldots, N; k = 1, 2, \ldots, K. \tag{8}$$

For speed sensorless drive, the speed is not directly measured and needs to be estimated. Therefore, the fault frequency cannot be tracked based on speed, but estimated by the measured current. Ideally, it is straightforward to find the frequency difference by computing the cross correlation between the frequency spectrum of the ith time window signal $[I_i(n_f)]$ and that of the jth time window signal $[I_j(n_f)]$ as $$\hat{L}_k(i, j) = \operatorname{argmax}_{n_d} \sum_{n_f} |I_i(n_f)| \cdot |I_j(n_f + n_d)|. \tag{9}$$

In practice, since the fault signal is very weak and very sensitive to noise interference, the solution of (9) may be inaccurate, and even far away from the truth value. Here $\hat{L}_k$ is used to represent the noisy frequency shift, and $L_k$ to represent the true frequency shift. The objective is then to recover $h_k$ from all noisy estimations $\{\hat{L}_k\}$.

Figure 8A:
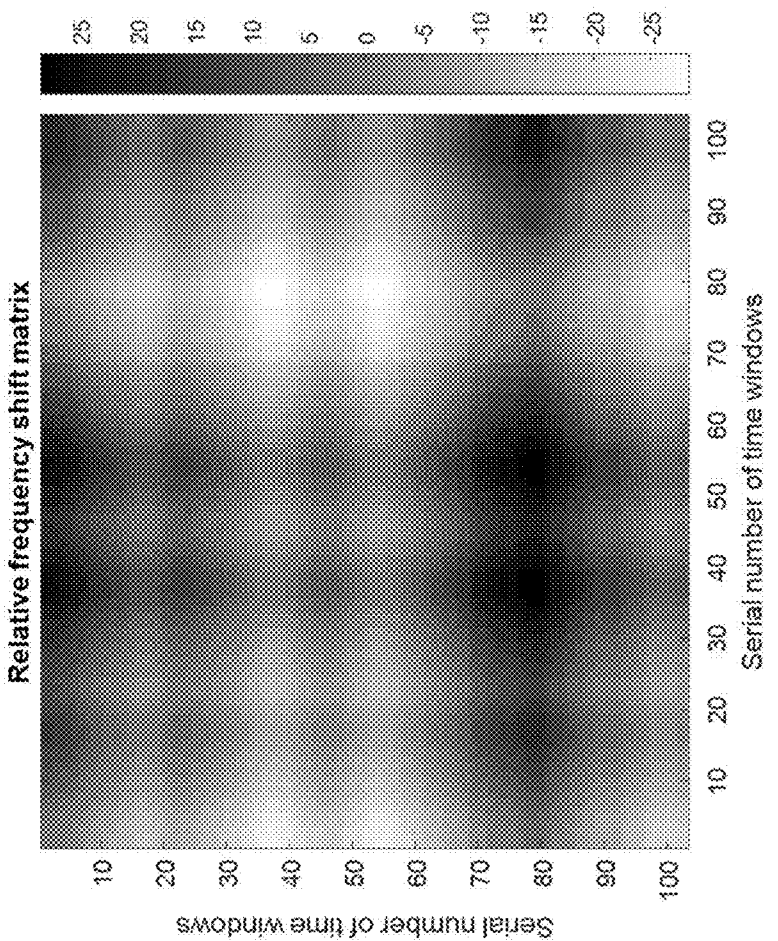
FIG. 8A is a plot of a relative frequency shift matrix estimated by STFT frequency spectrum of measured stator current, according to some embodiments of the present disclosure.

To improve the robustness, a relative frequency shift matrix $L_k=[L_k(i, j)] \in R^{N\times N}$ and a vector $l_k=[L_k(1, 1), \ldots, L_k(i, j), \ldots, L_k(N, N)]^T \in R^{N^2\times 1}$ can be further defined. In FIG. 8A, a plot of relative frequency shift matrix $\hat{L}_k$ is shown.

The matrix can be rewritten as $$L_k = h_k 1^T - 1 h_k^T \in R^{N\times N}, \tag{10}$$

where 1 is an N-dimensional vector with all entries equal to 1. It is straightforward to verify that for any real vector $h_k \neq a1$, where a is a real scalar, $$\operatorname{rank}(L_k) = \operatorname{rank}(h_k 1^T) + \operatorname{rank}(1 h_k^T) = 2. \tag{11}$$

$l_k$ can be expressed as (12)

$$l_k = A h_k,$$

with $$A = [\ldots, \alpha_{i,j}, \ldots]^T \in R^{N^2\times N}, \tag{13}$$

where vector $\alpha_{i,j} \in R^{1\times N}$ has all-zero entries except that $\alpha_{i,j}(i)=1$ and $\alpha_{i,j}(j)=-1$. Considering that the solution of equation (9) could be far away from the truth value, sparsity is imposed on the estimation error. Consequently, and corresponding to step 702 of FIG. 7, the frequency shift estimation problem is formulated as $$\min_{e,h_k} \frac{1}{2} \|\hat{l}_k - A h_k - e\|_2^2 + \lambda |e|_1, \tag{14}$$

where λ is the regularization parameter (used in $L_1$ regularization) and vector e represents large frequency shift error cause by interference. When λ=0 and e=0, equation (14) is reduced to the least squares method. When the interference is Gaussian noise, the least-squares method works well. In this case, where there exists other interference introduced by the inverter, sparsity-inspired optimization in equation (14) improves the robustness.

Figure 8B:
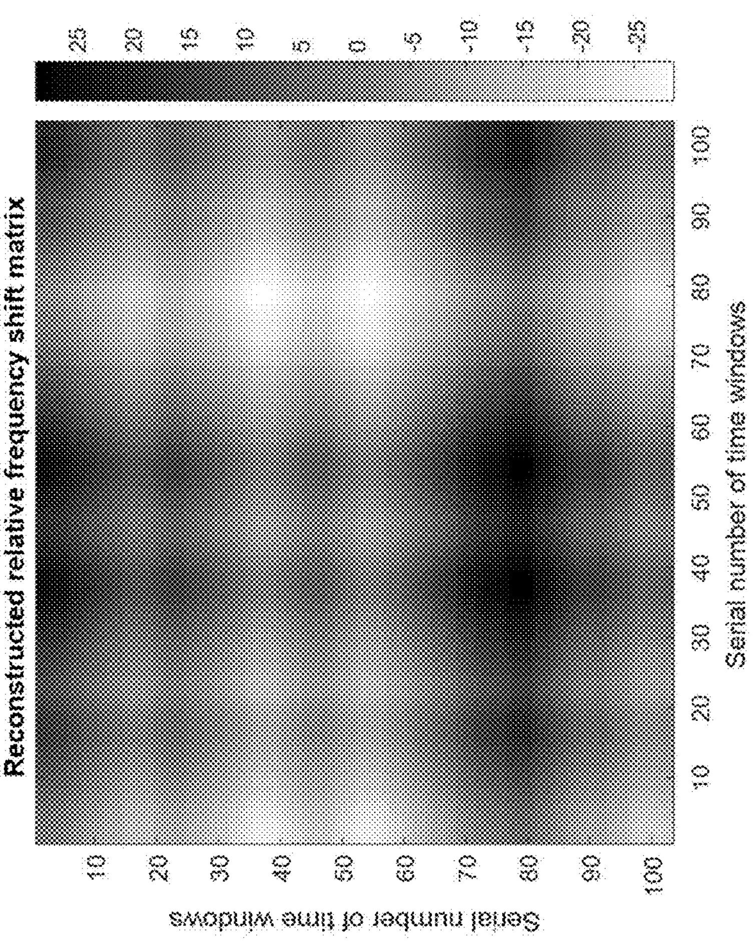
FIG. 8B is a plot of a reconstructed relative frequency shift matrix recovered by robust principal component analysis method, according to some embodiments of the present disclosure.
Figure 8C:
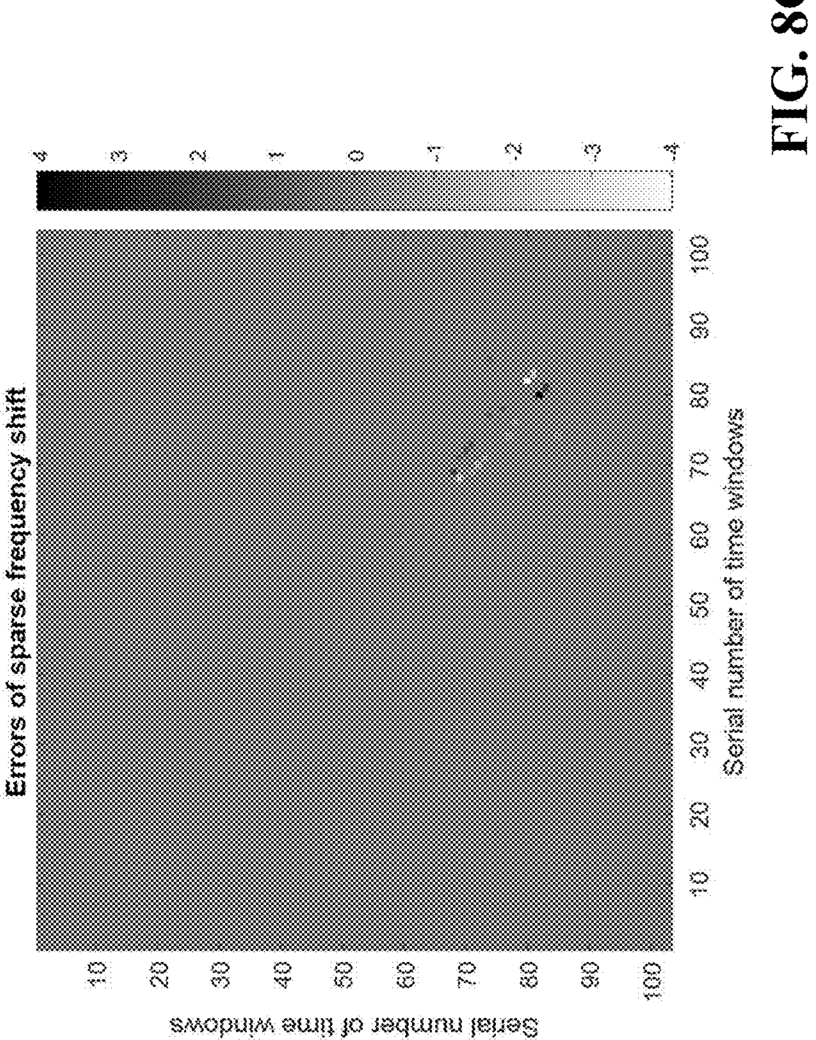
FIG. 8C is a plot of a sparse error matrix of frequency shift, according to some embodiments of the present disclosure.

Note that equation (14) is similar to the well-known robust PCA problem, which decomposes the observation matrix $\hat{L}_k$ into a low-rank matrix $L_k$ and a sparse noise matrix of reshaped e. Here, low-rankness is implicitly imposed, rather than using an explicit low-rank constraint. FIG. 8B shows a plot of relative frequency shift matrix $L_k$. FIG. 8C shows a plot of the sparse noise matrix of reshaped e.

To solve equation (14), the alternating minimization method is utilized by iteratively updating e and $h_k$ until its stopping criteria is satisfied. The sub-problem with respect to $h_k$ is a standard least-squares problem, which, corresponding to step 704 of FIG. 7, can be solved by $$h_k^{(t)} = A^{+}(\hat{I}_k - e^{(t-1)}), \tag{15}$$

where $A^+$ denotes the pseudo-inverse of A, and superscripts (t) and (t−1) represent the number of iterations during the process.

Corresponding to step 706 of FIG. 7, the sub-problem of e can be solved by a soft-thresholding process as $$e(t) = \max(0, \ |\hat{I}_k - Ah_k^{(t)}| - \lambda) \odot \text{sign}(\hat{I}_k - Ah_k^{(t)}). \tag{16}$$

Once the kth fault frequency $$\hat{h}_k = h_k^{(T)}$$

is properly estimated, the spectrum can be aligned, corresponding to step 708 of FIG. 7, by circularly shifting the ith time window frequency spectrum by $-h_k(i)$, i.e., $$[\overline{I}_{k,i}(n_f)] = circshift([I_i(n_f)], \ -\hat{h}_k(i)), \tag{17}$$

and, corresponding to step 710 of FIG. 7, forming a matrix of aligned spectra as $$\overline{I}_k = [[\overline{I}_{k,1}(n_f)], \ \ldots \ , [\overline{I}_{k,i}(n_f)], \ \ldots \ , [\overline{I}_{k,N}(n_f)]]. \tag{18}$$

Figures 9A, 9B:
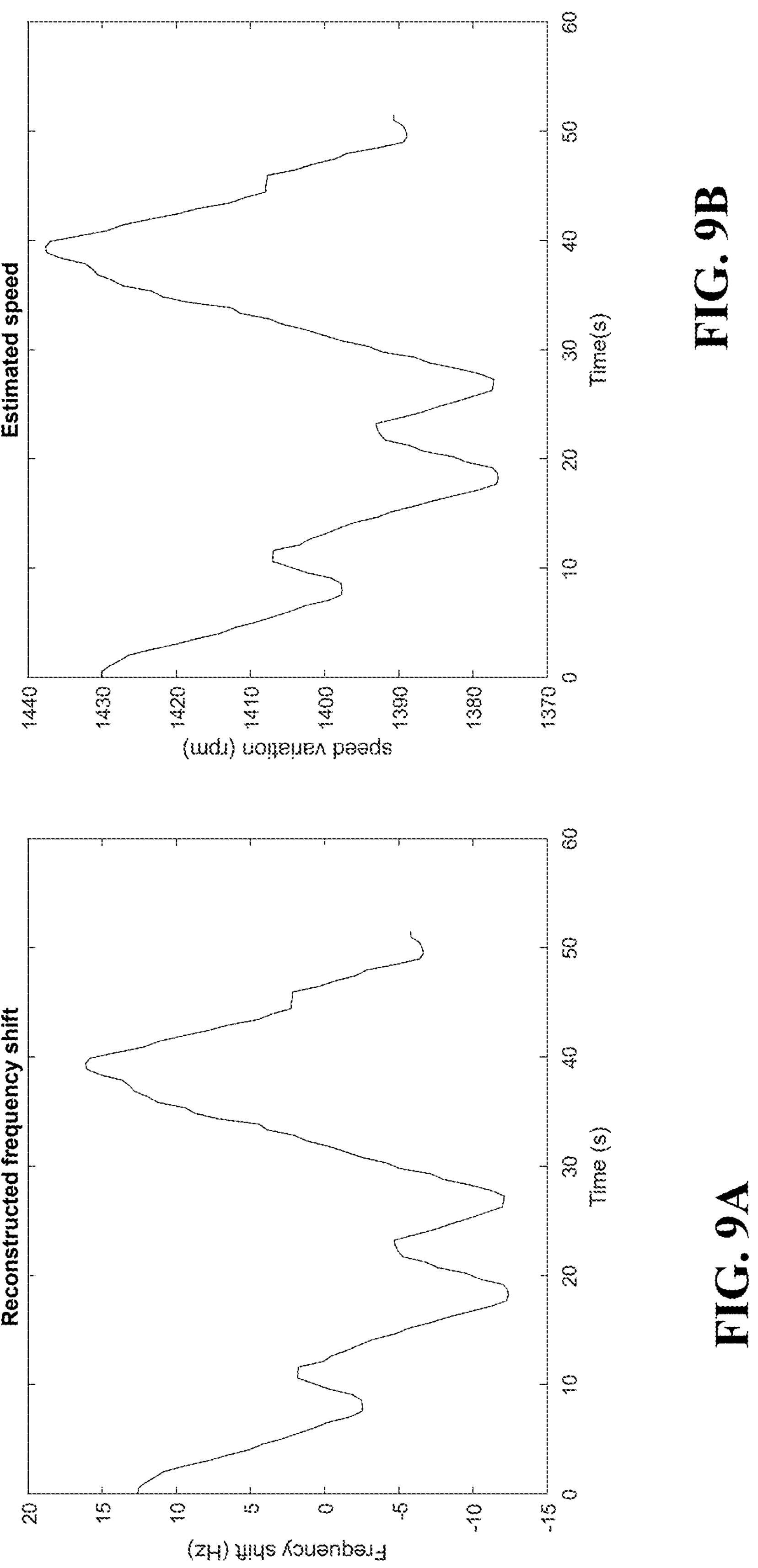
FIG. 9A is a plot of reconstructed frequency shift of each short-time window of an STFT frequency spectrum, according to some embodiments of the present disclosure.
FIG. 9B is a plot of estimated motor speed, according to some embodiments of the present disclosure.

In FIG. 9A a plot of $\hat{h}_k$ is shown. In FIG. 9B a plot of estimated motor speed is shown. The estimated motor speed may be determined based on equation (22), described below.

Corresponding to step 712 of FIG. 7, the left principal singular vector $u_{k,1}$ of matrix $\overline{I}_k$ is then computed using singular value decomposition $$\overline{I}_k = U_k \Sigma_k V_k^T = \sum_j \sigma_{k,j} u_{k,j} v_{k,j}^T. \tag{19}$$

Corresponding to step 714 of FIG. 7, the kth speed-independent frequency component $\hat{u}_{k,1}$ of stator current is achieved by simply thresholding the magnitude of $\hat{u}_{k,1}$ to keep large frequency components, for example with threshold equal to 10% of the maximum absolute value $u_{k,1}$, i.e., $$\hat{u}_{k,1} = \text{threshold}(u_{k,1}, 0.1 \times \max(\text{abs}(u_{k,1}))) \tag{20}$$

Note that $\hat{u}_{k,1}$ is independent to the operating speed due to the fault frequency alignment, and equivalent to that at a constant speed operation. Therefore, it is robust for varying speed operations. Corresponding to step 716 of FIG. 7, the denoised kth speed-dependent frequency component is achieved by shifting $\hat{u}_{k,1}$ to its original speed-dependent frequency as $$[\hat{I}_{k,i}(n_f)] = circshift\{[\sigma_{k,1}\hat{u}_{k,1}v_{k,1}^T(i)], \hat{h}_k(i)\}, \tag{21}$$

Based on the frequency shift estimation method, frequency components are iteratively aligned in frequency spectra of short-time windows and extracted as equivalent frequency components of steady operations.

Considering the fundamental operating frequency is typically the strongest frequency component, the fundamental frequency and its harmonics are first extracted. For fixed operating frequency, although the load variation causes fluctuation of the stator current magnitude, the stator current magnitude is relatively stable for the operating frequency. Therefore, in the frequency spectrum, the operating frequency and its harmonics can be extracted simply by the average value and the variation value. For each frequency, if its variation value is less than a preset threshold and the average value is greater than another preset threshold, these frequencies can be treated as the operating frequency harmonics.

For slot harmonics, which are related to eccentricity and other faults, the proposed frequency shift estimation method is employed to align slot harmonics and extract them from the aligned frequency spectra. In this way, the frequency shifts of the slot harmonics are compensated, resulting in stabilized slot harmonics in a fixed frequency line. Recalling that all slot harmonics are evenly separated by $f_s$ according to equation (5), all slot harmonics can be aligned and extracted simultaneously. According to equation (5), given the dominant slot harmonic of static eccentricity $n_d=0$, motor speed can also be estimated as $$n_r = \frac{60}{Z}(f_{slt} - vf_s). \tag{22}$$

An example of a plot of motor speed estimation according to equation (22) is shown in FIG. 9B.

For broken-bar fault frequency, besides the proposed method, an alternative way to estimate broken-bar fault frequency is to make use of the estimated frequency shift vector for slot harmonics. According to equations (3) and (5), it is straightforward to infer the broken-bar fault frequency shift can be expressed as $$h_{k_b} = \pm \frac{2p}{Z} h_{k_s}, \tag{23}$$

where the subscript integers $k_s$ and $k_b$ represent the serial numbers of slot harmonics and broken-bar fault frequency respectively. Given $h_{k_b}$, the two broken-bar fault frequency components indicated by equation (3) with τ=1 can be aligned and extracted respectively.

Once all frequency components of interest have been extracted, the denoised STFT spectrum can be achieved by shifting each of the extracted frequency components to its original speed-dependent frequency as $$[\hat{I}_i(n_f)] = \left[\sum_k [\hat{I}_{k,i}(n_f)]\right], \tag{24}$$

And, corresponding to step 718 of FIG. 7, synthesize the final equivalent speed-independent frequency spectrum of the whole time-domain measurement as $$\hat{I}_s = \sum_k \sigma_{k,1}\hat{u}_{k,1}. \quad (25)$$

Figure 10A:
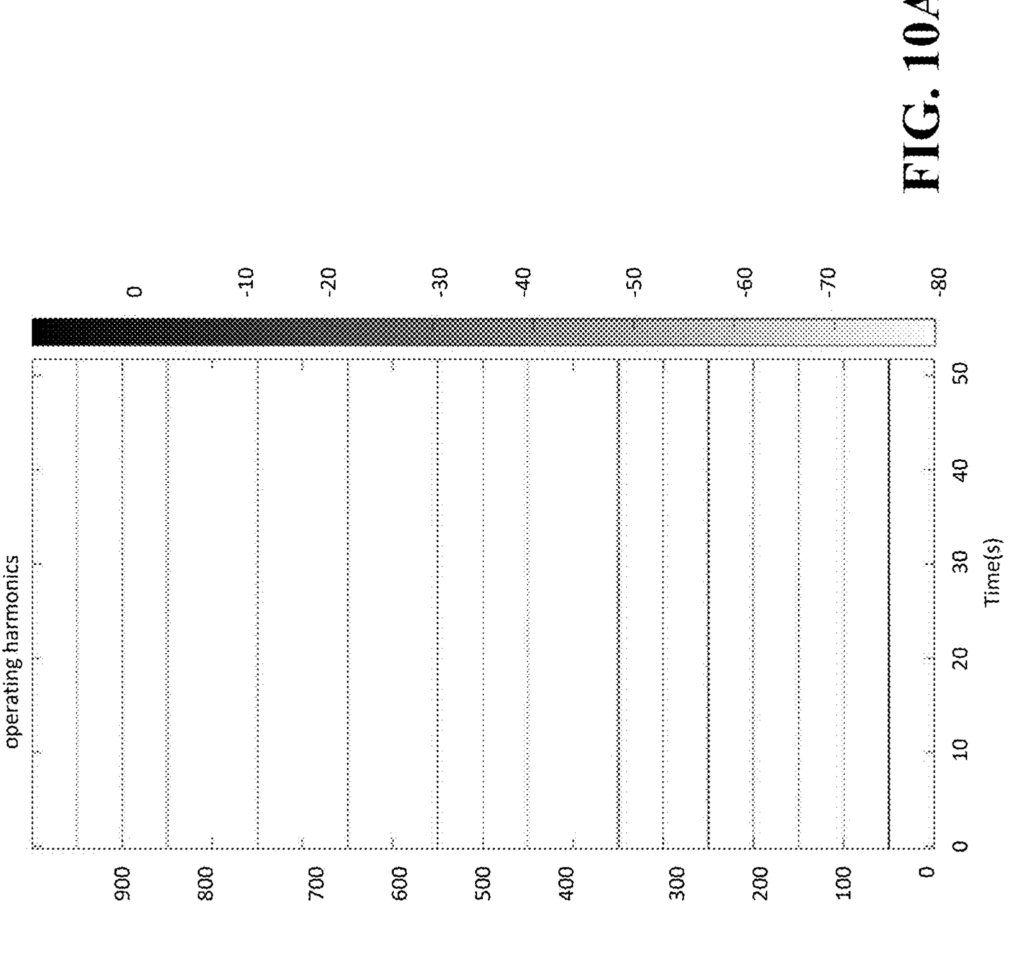
FIG. 10A plots an extracted operating frequency component and its harmonics with respect to time, according to some embodiments of the present disclosure.
Figure 10B:
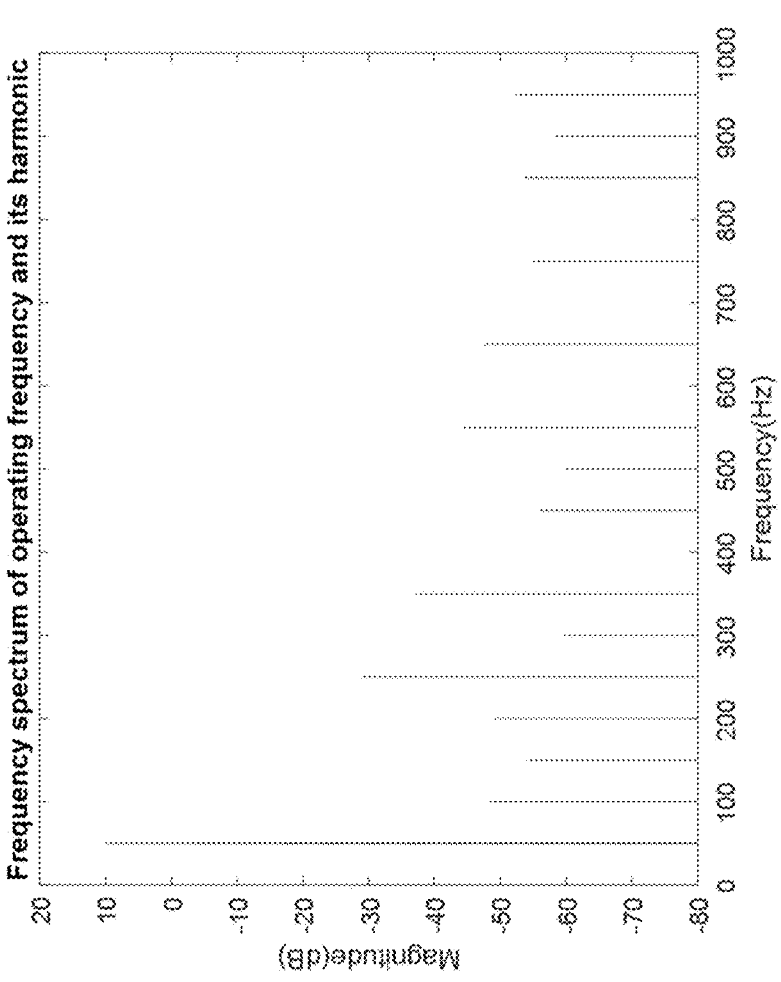
FIG. 10B plots an average magnitude of an exemplar extracted operating frequency component and its harmonics, according to some embodiments of the present disclosure.
Figure 10C:
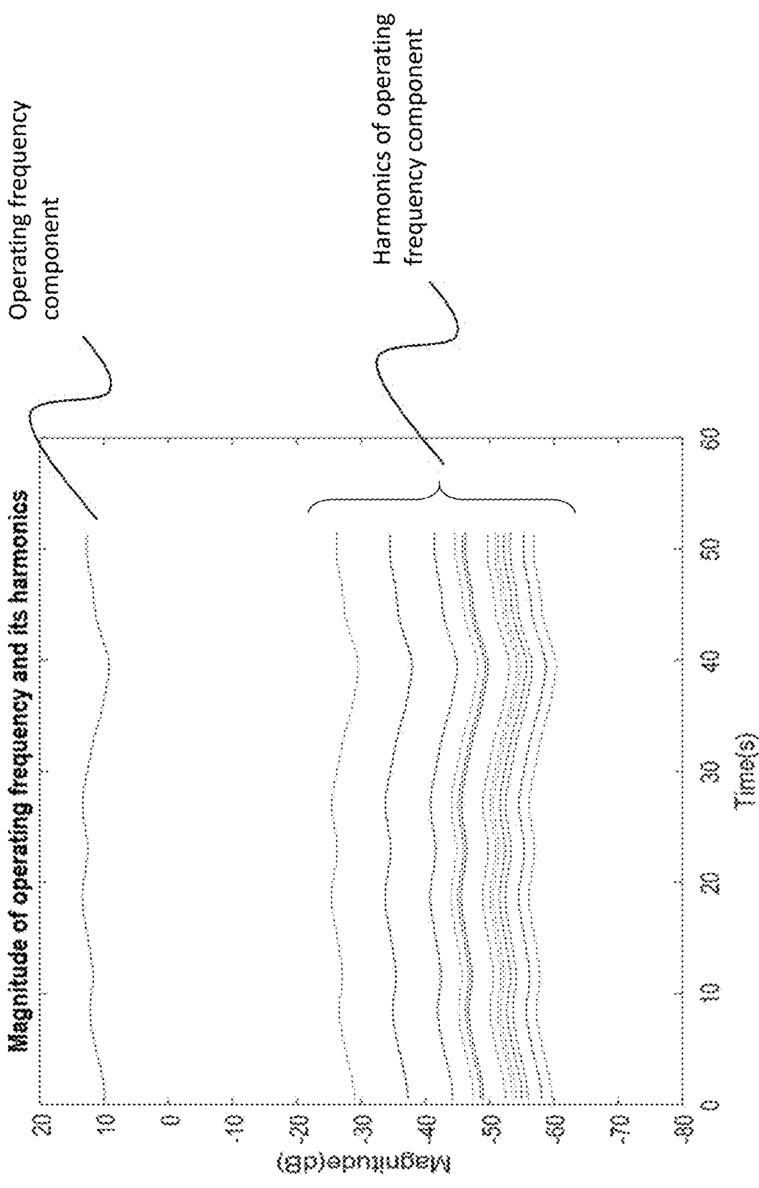
FIG. 10C plots the magnitudes of the exemplar extracted operating frequency component and its harmonics changing over time, according to some embodiments of the present disclosure.

Operating frequency and its harmonics, slot harmonics, and broken-bar fault frequencies are then iteratively extracted. In FIG. 10A, the extracted operating frequency component and its harmonics are plotted with respect to time. In FIG. 10B, the average magnitude of the extracted operating frequency component and its harmonics is plotted with respect to frequency. As shown in FIG. 10B, the operating frequency component and the harmonics form spikes in the frequency domain. In FIG. 10C, the magnitudes of extracted operating frequency and its harmonics are plotted as changing over time.

Figure 11A:
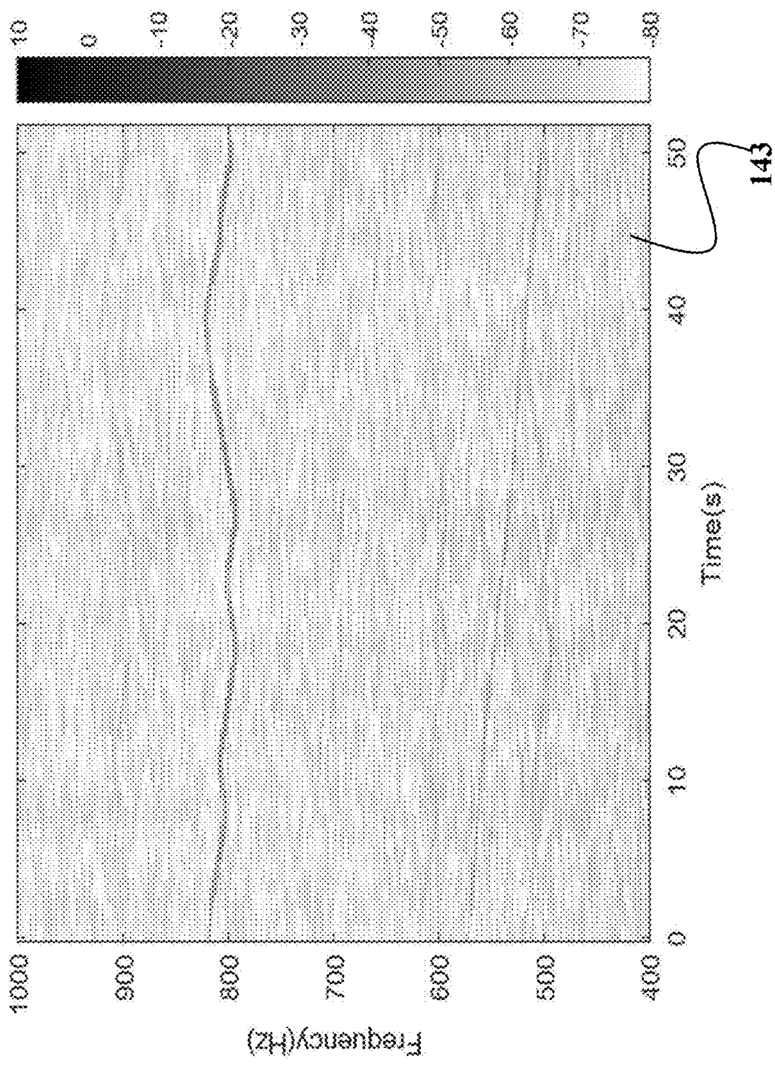
FIG. 11A is a plot of a zoomed-in version of an STFT spectrum in the range of slot harmonics, according to some embodiments of the present disclosure.
Figure 11B:
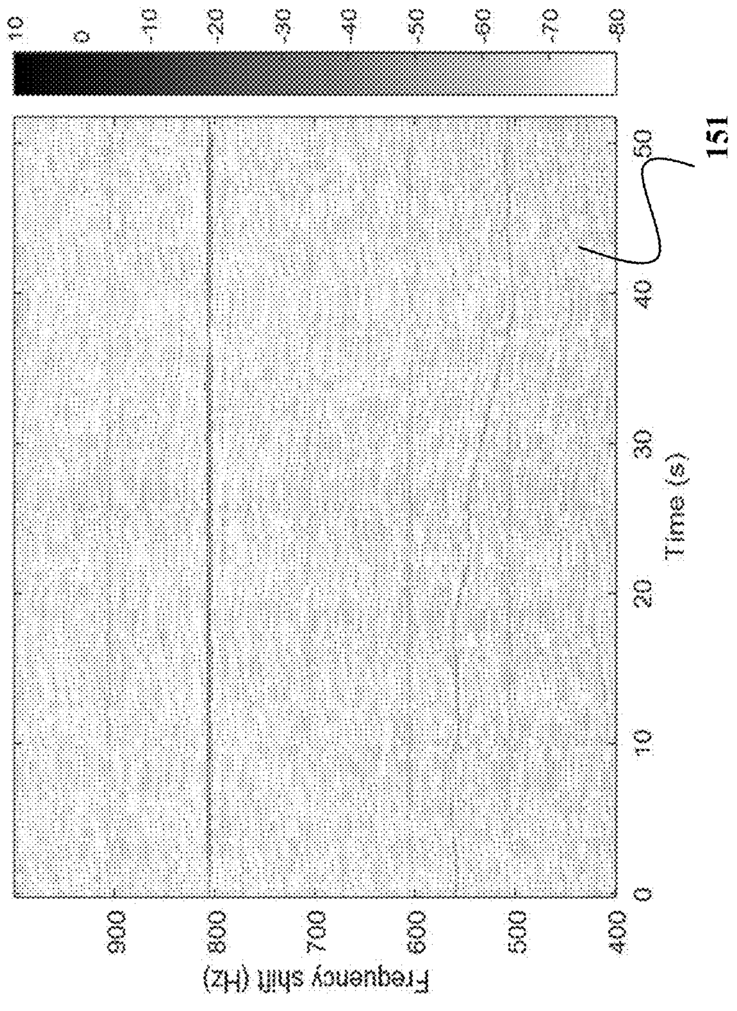
FIG. 11B is a plot of an aligned STFT spectrum in the range of slot harmonics after A circular frequency shift, according to some embodiments of the present disclosure.
Figure 11C:
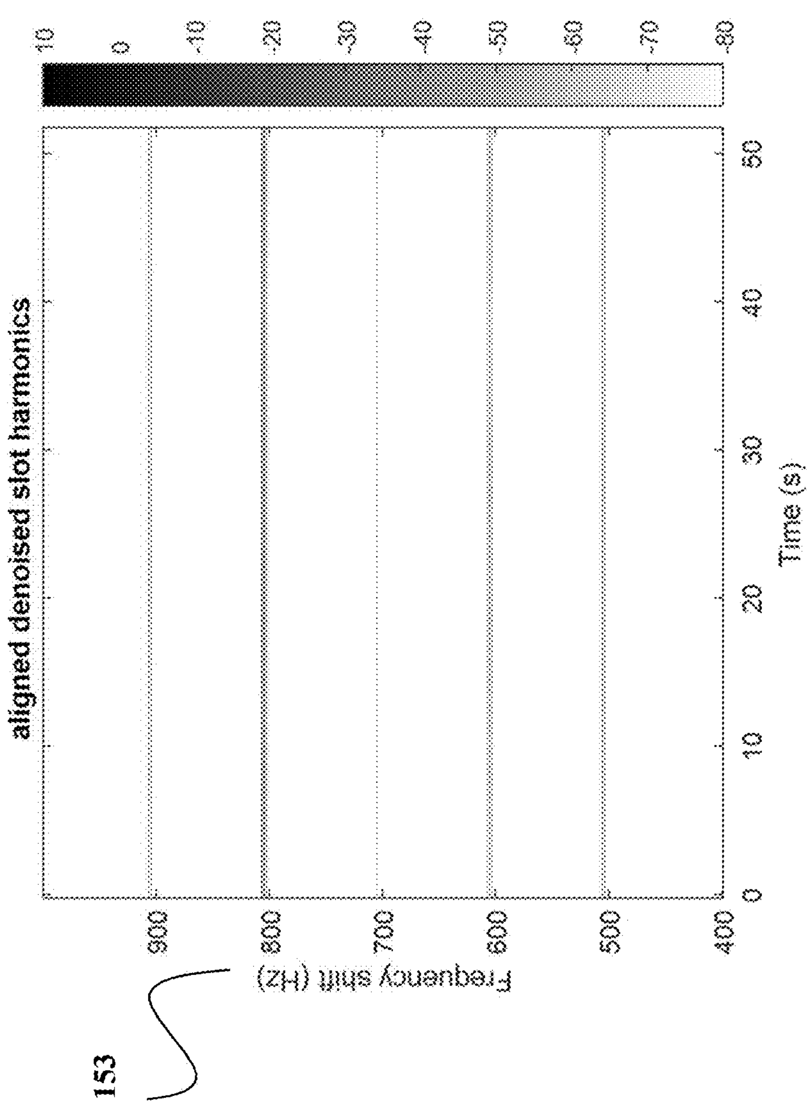
FIG. 11C is a plot of fault frequency components extracted using singular value decomposition, according to some embodiments of the present disclosure.
Figure 11D:
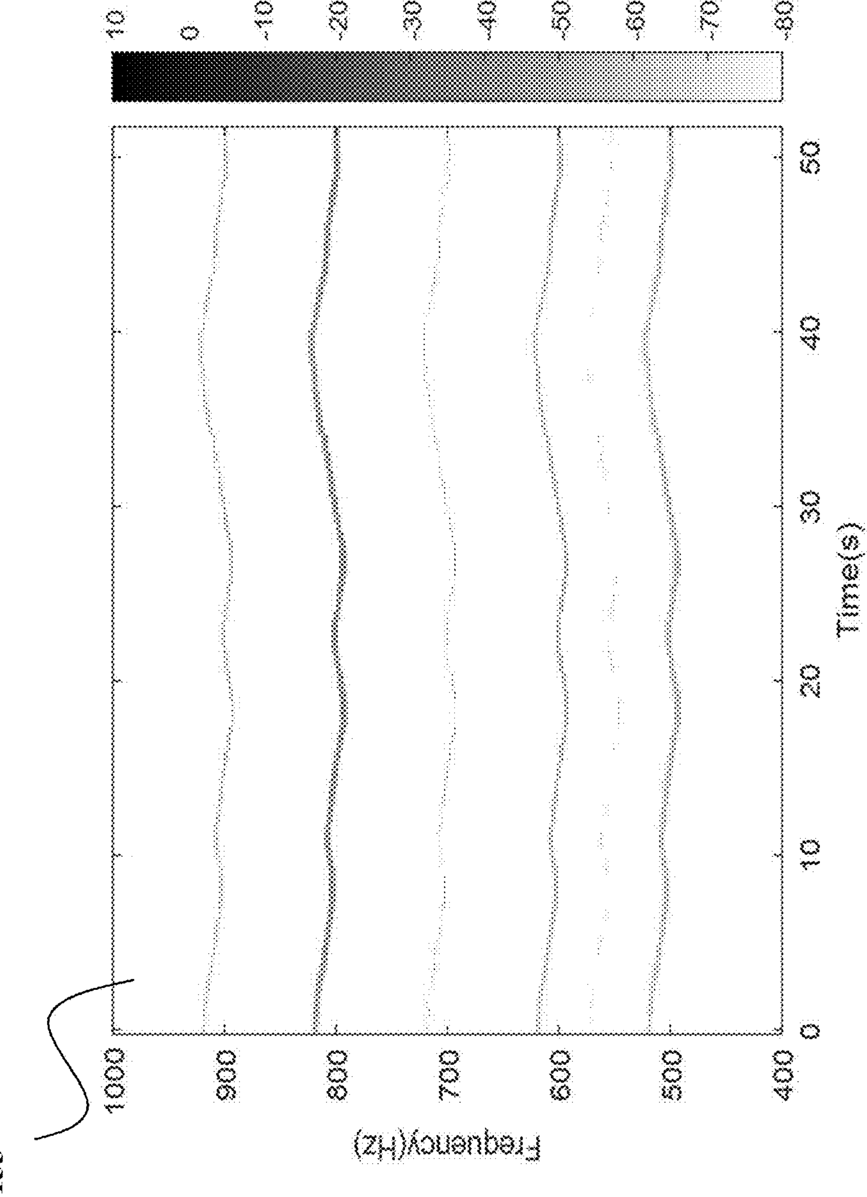
FIG. 11D is a plot of denoised slot harmonics after a circular frequency shift of the extracts the fault frequency components in FIG. 11C, according to some embodiments of the present disclosure.

FIG. 11A is a plot of a zoomed-in version of an STFT spectrum 143 in the range of slot harmonics found between 400 Hz and 1 kHz. FIG. 11B is a plot of an aligned STFT spectrum 151 in the range of slot harmonics after circular frequency shift. FIG. 11C is a plot of fault frequency components (including slot harmonics) 153 extracted using singular value decomposition, while FIG. 11D is a plot of denoised slot harmonics 155 after circular frequency shift of the extracted fault frequency components 153 in FIG. 11C according to equation (21).

Figure 12A:
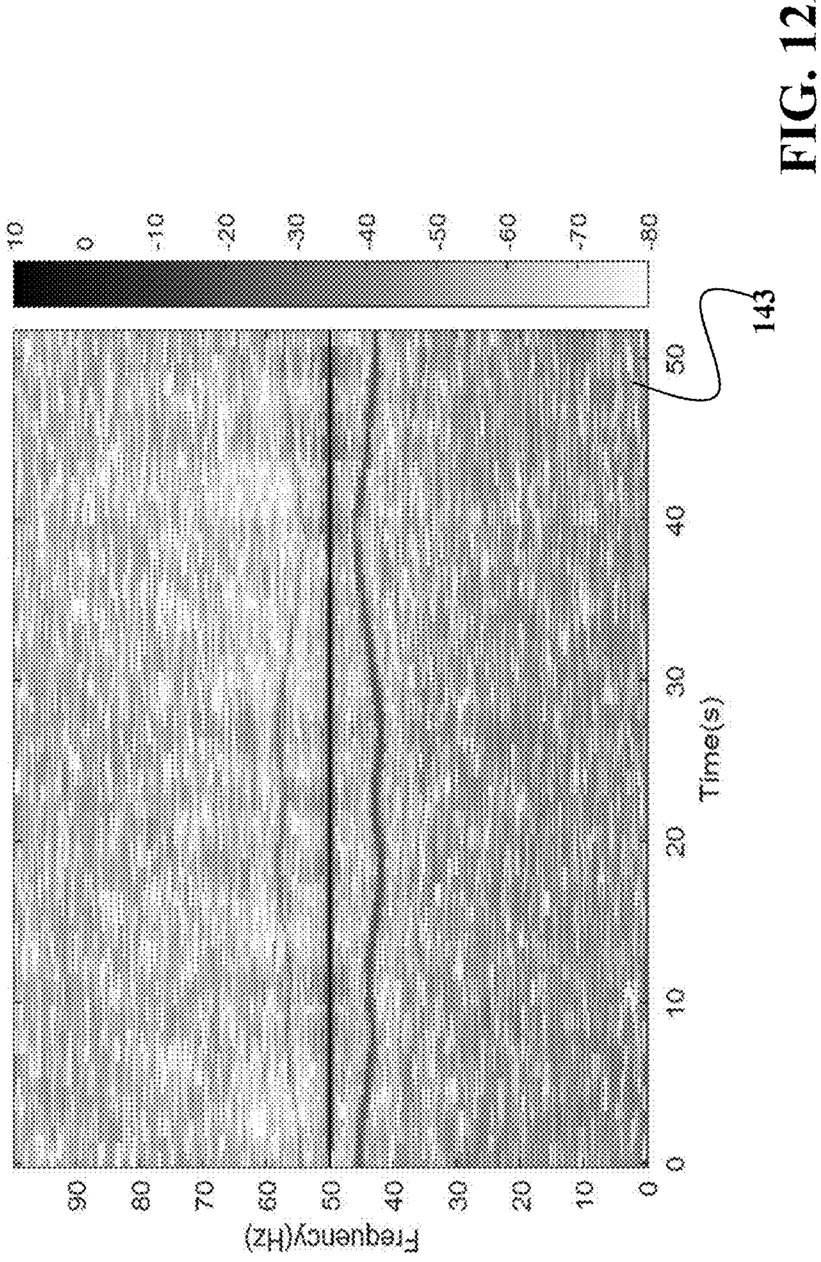
FIG. 12A is a plot of a zoomed-in version of an STFT spectrum in the range of broken-bar fault frequencies, according to some embodiments of the present disclosure.
Figure 12B:
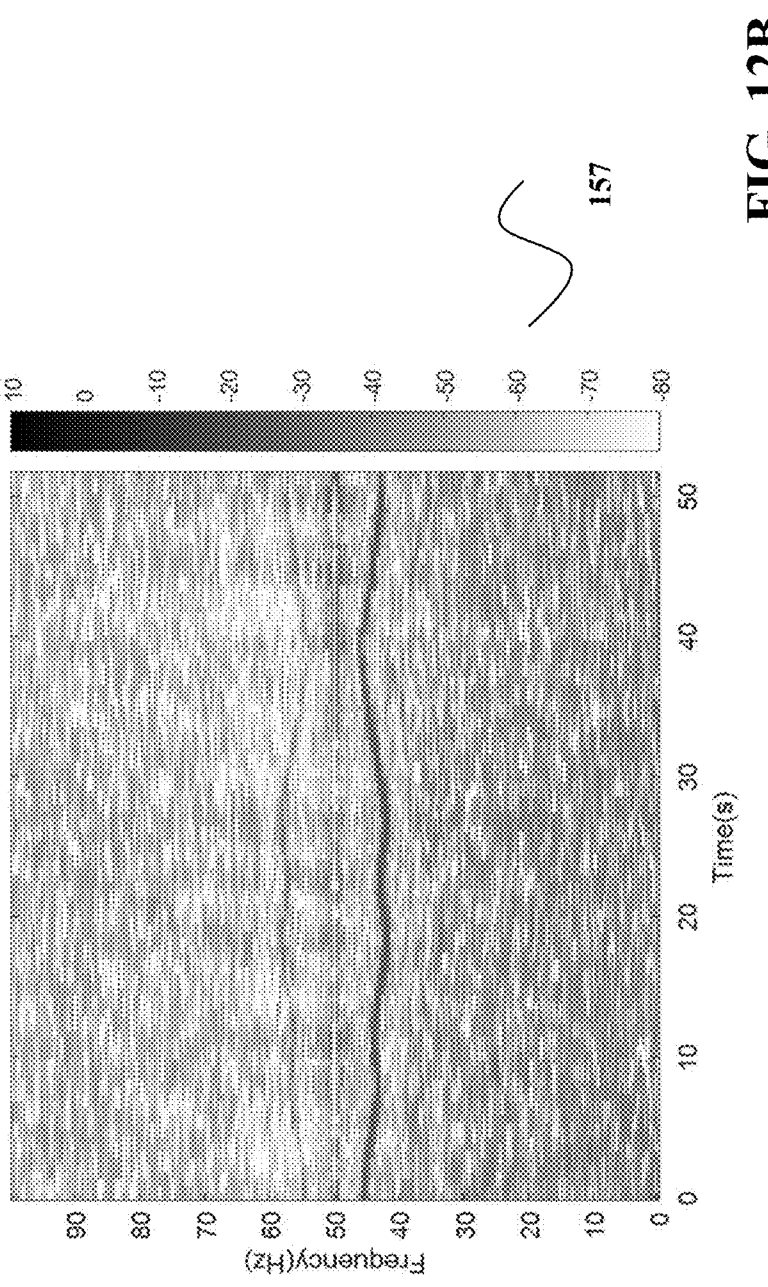
FIG. 12B is a plot the STFT spectrum after removing an operating frequency component, according to some embodiments of the present disclosure.
Figure 12C:
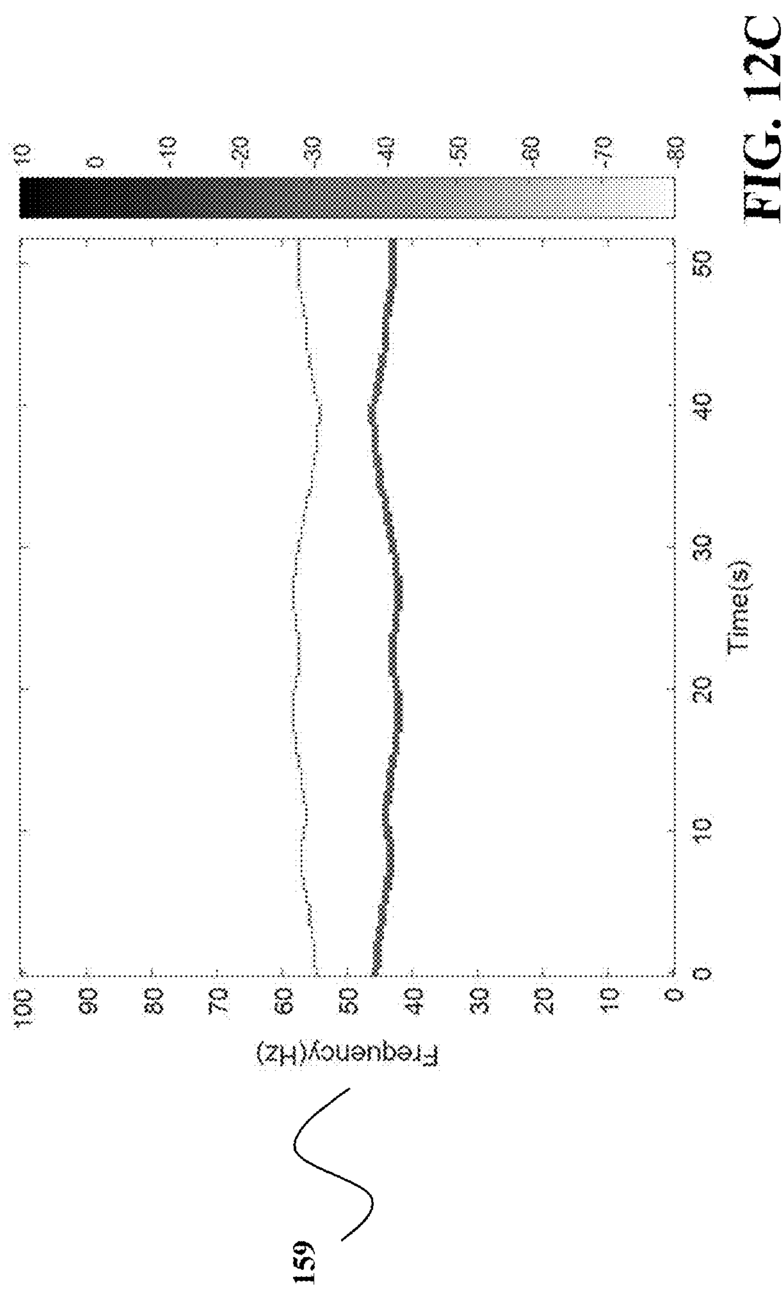
FIG. 12C is a plot of extracted broken-bar fault frequency components, according to some embodiments of the present disclosure.

It can be observed that all slot harmonics are very well extracted, even those very weak slot harmonics 153 under strong interference indicated by the straight line in FIG. 11C in the frequency range of 500 to 600 Hz. FIG. 12A illustrates a plot of a zoomed-in version of the STFT spectrum 143 in the range of broken-bar fault frequencies from 0 to 100 Hz. FIG. 12B illustrates a plot the STFT spectrum 157 after removing the operating frequency component at 50 Hz. FIG. 12C illustrates extracted broken-bar fault signatures 159. As can be seen in FIG. 12C, both the characteristic fault signature below 50 Hz and the secondary fault signature above 50 Hz are extracted from the noisy current measurement.

Figures 13A, 13B:
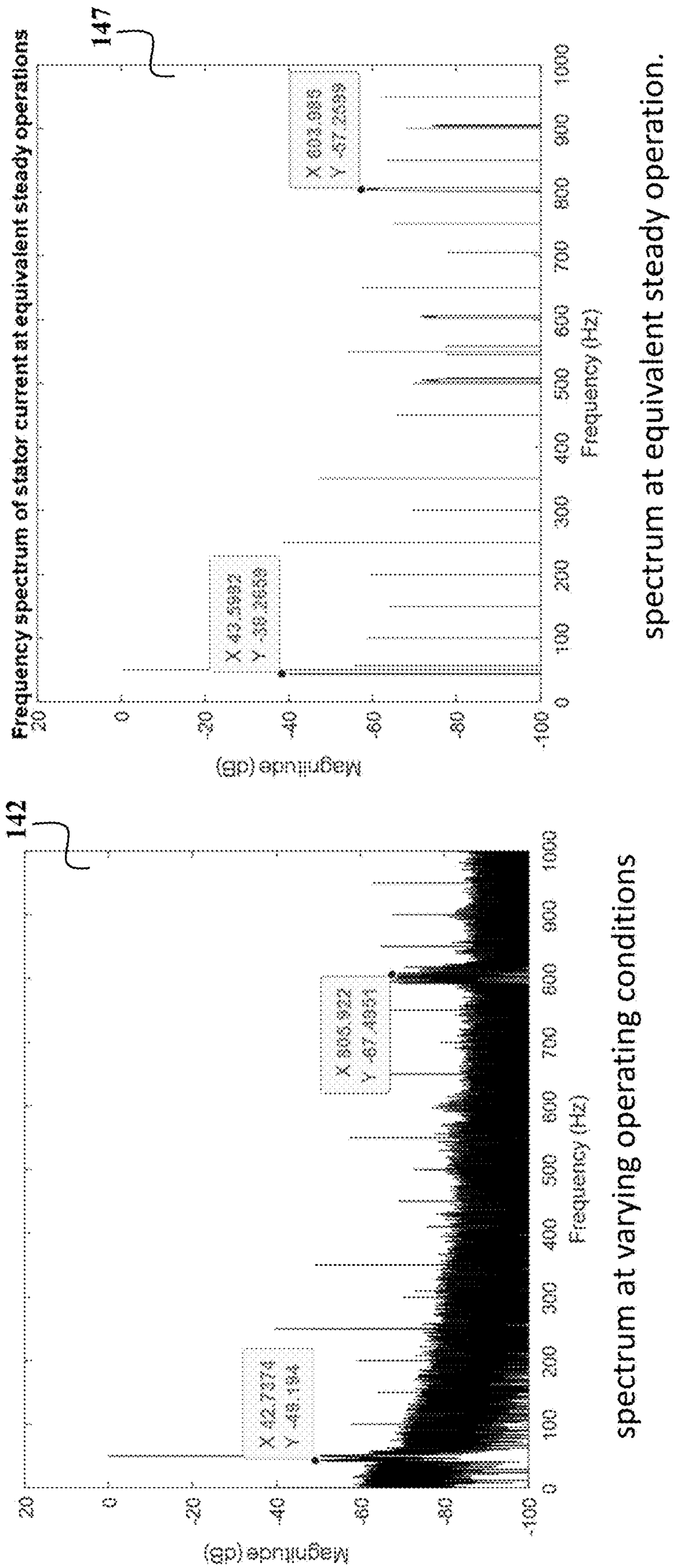
FIG. 13A is a plot of Fourier frequency spectra of a large time window when a motor is operating at varying speed, according to some embodiments of the present disclosure.
FIG. 13B is a plot of an equivalent spectrum of stator current of a large time window equivalent to that of a stator current of a motor operating at a constant speed, according to some embodiments of the present disclosure.

FIGS. 13A and 13B present frequency spectra of the whole measurement of a large time window when the motor 100 is operating at varying speed. For comparison, FIG. 13A shows the Fourier spectrum 142 of the stator current 141 where the operating frequency component magnitude is normalized. FIG. 13B shows the equivalent spectrum of stabilized harmonics 147 generated using equation (25). It can be observed that due to varying speed operation, the broken-bar fault frequency magnitude (at approximately 43 Hz as shown in FIGS. 12A-12C) and slot harmonic magnitude (at approximately 800 Hz as shown in FIGS. 11A-11D) of FIG. 13A are each about 10 dB lower than that of the equivalent spectrum of stabilized harmonics 147 corresponding to operation at constant speed shown in FIG. 13B. Accordingly, FIGS. 13A and 13B demonstrate that the proposed method can improve the performance of detection and severity estimation for motors operating at varying-speed and varying-load conditions.

All definitions, as defined and used herein, should be understood to control over dictionary definitions, definitions in documents incorporated by reference, and/or ordinary meanings of the defined terms.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements can optionally be present other than the elements specifically identified by the "and/or" clause, whether related or unrelated to those elements specifically identified.

As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e. "one or the other but not both") when preceded by terms of exclusivity, such as "either," "one of," "only one of," or "exactly one of."

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements can optionally be present other than the elements specifically identified within the list of elements to which the phrase "at least one" refers, whether related or unrelated to those elements specifically identified.

It should also be understood that, unless clearly indicated to the contrary, in any methods claimed herein that include more than one step or act, the order of the steps or acts of the method is not necessarily limited to the order in which the steps or acts of the method are recited.

In the claims, as well as in the specification above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively.

The above-described examples of the described subject matter can be implemented in any of numerous ways. For example, some aspects can be implemented using hardware, software or a combination thereof. When any aspect is implemented at least in part in software, the software code can be executed on any suitable processor or collection of processors, whether provided in a single device or computer or distributed among multiple devices/computers.

The present disclosure can be implemented as a system, a method, and/or a computer program product at any possible technical detail level of integration. The computer program product can include a computer readable storage medium (or media) having computer readable program instructions thereon for causing a processor to carry out aspects of the present disclosure.

The computer readable storage medium can be a tangible device that can retain and store instructions for use by an instruction execution device. The computer readable storage medium can be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network can comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present disclosure can be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions can execute entirely on the user's computer, partly on the user's computer, as a stand-alone software package, partly on the user's computer and partly on a remote computer or entirely on the remote computer or server. In the latter scenario, the remote computer can be connected to the user's computer through any type of network, including a local area network (LAN) or a wide area network (WAN), or the connection can be made to an external computer (for example, through the Internet using an Internet Service Provider). In some examples, electronic circuitry including, for example, programmable logic circuitry, field-programmable gate arrays (FPGA), or programmable logic arrays (PLA) can execute the computer readable program instructions by utilizing state information of the computer readable program instructions to personalize the electronic circuitry, in order to perform aspects of the present disclosure.

Aspects of the present disclosure are described herein with reference to flowchart illustrations and/or block diagrams of methods, apparatus (systems), and computer program products according to examples of the disclosure. It will be understood that each block of the flowchart illustrations and/or block diagrams, and combinations of blocks in the flowchart illustrations and/or block diagrams, can be implemented by computer readable program instructions.

The computer readable program instructions can be provided to a processor of a, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions can also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram or blocks.

The computer readable program instructions can also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various examples of the present disclosure. In this regard, each block in the flowchart or block diagrams can represent a module, segment, or portion of instructions, which comprises one or more executable instructions for implementing the specified logical function (s). In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Other implementations are within the scope of the following claims and other claims to which the applicant can be entitled.

While various examples have been described and illustrated herein, those of ordinary skill in the art will readily envision a variety of other means and/or structures for performing the function and/or obtaining the results and/or one or more of the advantages described herein, and each of such variations and/or modifications is deemed to be within the scope of the examples described herein. More generally, those skilled in the art will readily appreciate that all parameters, dimensions, materials, and configurations described herein are meant to be exemplary and that the actual parameters, dimensions, materials, and/or configurations will depend upon the specific application or applications for which the teachings is/are used. Those skilled in the art will recognize, or be able to ascertain using no more than routine experimentation, many equivalents to the specific examples described herein. It is, therefore, to be understood that the foregoing examples are presented by way of example only and that, within the scope of the appended claims and equivalents thereto, examples can be practiced otherwise than as specifically described and claimed. Examples of the present disclosure are directed to each individual feature, system, article, material, and/or method described herein. In addition, any combination of two or more such features, systems, articles, materials, and/or methods, if such features, systems, articles, materials, and/or methods are not mutually inconsistent, is included within the scope of the present disclosure.

What is claimed is:

1. A system for controlling an operation of an induction motor, wherein the induction motor comprises circuitry and a memory, wherein the memory, having instructions stored thereon that, when executed by the circuitry, causes the system to:

collect time-domain measurements of a stator current of the induction motor operating under varying conditions;

transform the time-domain measurements into a spectral domain using a sequence of short-time Fourier transforms (STFTs) based on sliding time windows over the time-domain measurements;

perform spectral analysis in the spectral domain of the stator current to determine harmonics of different types present in the stator current of the induction motor and stabilize the determined harmonics to a shape of corresponding harmonics of the induction motor when operating under steady-state conditions by compensating speed-dependent frequency shifts of the harmonics across the sliding time windows to align the harmonics into a speed-independent spectral representation; and perform one or a combination of control, fault detection, and/or monitoring of the induction motor based on the stabilized harmonics of the induction motor.

2. The system of claim 1, wherein the varying conditions comprise varying speed conditions.

3. The system of claim 1, wherein the varying conditions comprise varying load conditions.

4. The system of claim 1, wherein stabilization of the harmonics of different types is subject to different constraints on the shape of the harmonics.

5. The system of claim 4, wherein the harmonics of different types include harmonics of an operating frequency component of the induction motor, and wherein the shape constraints on the harmonics of the operating frequency component force the harmonics of the operating frequency component to form straight lines in the spectral domain.

6. The system of claim 4, wherein the harmonics of different types include slot harmonics, and wherein the shape constraints on the slot harmonics force the slot harmonics to have a varying speed-dependent frequency shift for different instances of time, and wherein the frequency shift is determined by a sparsity-driven optimization problem using $L_1$ regularization.

7. The system of claim 6, wherein the harmonics of different types include broken-bar fault frequencies, and wherein the shape constraints on the broken-bar fault frequencies force the broken-bar fault frequencies to have a frequency shift, and wherein the frequency shift is a fixed fraction of the frequency shift of the slot harmonics for different instances of time.

8. The system of claim 7, wherein the fixed fraction is based on one or more motor parameters.

9. The system of claim 8, wherein the one or more motor parameters include number of slots and number of pole pairs.

10. The system of claim 1, wherein the circuitry is configured to detect harmonics of the operating frequency component based on magnitude variation of spectral frequency values over different instances of time to estimate current shapes of the harmonics of the operating frequency component and fit a straight line into a current shape of each of the harmonics of the operating frequency component, such that the straight lines define stabilized harmonics of the operating frequency component.

11. The system of claim 1, wherein the circuitry is configured to:

determine frequency shifts of slot harmonics corresponding to an eccentricity fault based on a robust sparsity-driven method using Li regularization; and compensate the frequency shift of each time window spectrum, such that the slot harmonics after frequency compensation define stabilized slot harmonics in a fixed frequency line.

12. The system of claim 11, wherein the circuitry is configured to:

determine a frequency shift of broken-bar fault harmonics based on the corresponding frequency shifts of slot harmonics; and compensate the frequency shifts of two broken-bar fault signatures, one broken-bar fault signature below operating frequency and one broken-bar fault signature above the operating frequency, respectively, such that the two broken-bar fault signatures define frequencies of stabilized broken-bar fault signatures.

13. The system of claim 1, wherein, to stabilize harmonics of a fault frequency component detected in the spectral domain of the induction motor operating under the varying conditions into a corresponding stabilized fault frequency component of the induction motor operating under steady-state conditions, the circuitry is configured to:

determine frequency shifts of the fault frequency component in different spectra produced by STFTs in the sequence of STFTs; and align the frequency shifts of the fault frequency component to produce the stabilized fault harmonics.

14. The system of claim 13, wherein, to determine the frequency shifts of the fault harmonics, the circuitry is configured to:

correlate frequency spectrums of neighboring STFTs in the sequence of STFTs to produce noisy frequency shifts subject to sparse non-Gaussian noise; and perform a sparse recovery of the noisy frequency shifts to denoise the frequency shifts.

15. The system of claim 14, wherein the sparse recovery includes an $L_1$ regularizer on the sparse non-Gaussian noise.

16. The system of claim 14, wherein the circuitry is configured to solve the sparse recovery using an alternating minimization iteratively updating the frequency shifts and a sparse noise matrix of the sparse non-Gaussian noise.

17. The system of claim 13, wherein the circuitry is configured to:

align the frequency shifts of the fault harmonics on a circular shift to produce a matrix of aligned spectra; and perform a singular value decomposition of the matrix of aligned spectra to produce the stabilized fault harmonic.

18. The system of claim 17, wherein the stabilized fault frequency is determined as the largest frequency component of a left principal singular vector of the singular value decomposition of the matrix of aligned spectra.

19. The system of claim 1, wherein, to stabilize harmonics of a fault frequency component detected in the spectral domain of the induction motor operating under the varying conditions into a corresponding stabilized fault frequency of the induction motor operating under a steady-state conditions, the circuitry is configured to:

determine frequency shifts of the fault frequency component in different spectra produced by STFTs in the sequence of STFTs; and perform a sparse recovery of the stabilized fault frequency subject to the frequency shifts.

20. The system of claim 19, wherein the circuitry is further configured to estimate motor speed of the induction motor based on the frequency shifts.

* * * * *